United States Patent
Haneda

(10) Patent No.: US 6,438,086 B1
(45) Date of Patent: Aug. 20, 2002

(54) RECORDING APPARATUS AND METHOD, REPRODUCING APPARATUS AND METHOD, AND RECORDING MEDIUM

(75) Inventor: Naoya Haneda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/349,887

(22) Filed: Jul. 8, 1999

(30) Foreign Application Priority Data

| Jul. 13, 1998 | (JP) | 10-197389 |
| Jul. 13, 1998 | (JP) | 10-197391 |
| Jun. 29, 1999 | (JP) | 11-182894 |
| Jun. 29, 1999 | (JP) | 11-182895 |

(51) Int. Cl.$^7$ .................................................. G11B 5/09
(52) U.S. Cl. ............................... 369/59.25; 369/53.24; 711/100
(58) Field of Search ............................ 369/47.15, 47.16, 369/47.19, 47.2, 47.22, 47.23, 47.31, 53.24, 53.31, 53.2, 53.21, 47.54, 59.25, 275.3; 710/33, 29, 30, 34, 35, 45; 711/170, 171, 172, 100, 111–114

(56) References Cited

U.S. PATENT DOCUMENTS

| 5,717,953 A | * | 2/1998 | Tsutsui et al. ................. 710/58 |
| 5,724,612 A | * | 3/1998 | Haneda et al. ................. 710/35 |
| 5,805,544 A | * | 9/1998 | Haneda .................... 369/47.23 |
| 6,094,693 A | * | 7/2000 | Haneda ....................... 711/100 |
| 6,185,665 B1 | * | 2/2001 | Owada et al. ............... 711/112 |

* cited by examiner

Primary Examiner—Thang V. Tran
(74) Attorney, Agent, or Firm—Sonnenschein, Nath & Rosenthal

(57) ABSTRACT

A recording medium is formed of a plurality of flash memories. A recording medium controller manages the recording status of the plurality of flash memories in units of blocks. The recording medium controller controls a data recording process so that data is recorded in such a manner that one or more parallel block sets are constructed which consist of one or more blocks the number of which is determined in accordance with a minimum number of blocks required to obtain a minimum waiting time in the process of recording data in a parallel fashion into the one or more blocks of the recording medium, and the data is recorded in the parallel fashion in the one or more blocks of the one or more parallel block sets, thereby recording data on the recording medium at a high speed. The recording medium controller also controls the data recording process so that data is recorded in such a manner that one or more parallel block sets each consisting of one or more blocks used to record the data are constructed in such a manner as not to create a significant difference in the size of a writable area available for recording data among the plurality of flash memories, and the data is recorded in the parallel fashion in the one or more blocks of the one or more parallel block sets, thereby recording data on the recording medium without creating a significant difference in the writable area size.

86 Claims, 17 Drawing Sheets

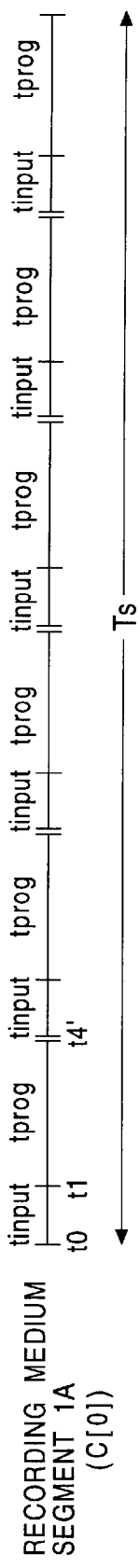
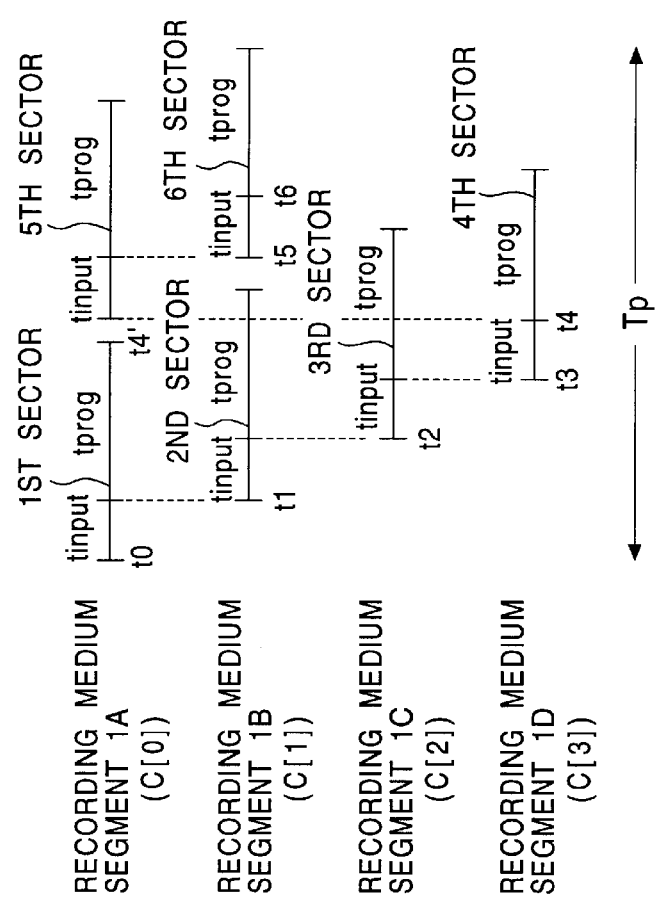
FIG. 3A
FIG. 3B

RECORDING APPARATUS AND METHOD, REPRODUCING APPARATUS AND METHOD, AND RECORDING MEDIUM

BACKGROUND OF THE INVENTION

1. Field of the Invention

The present invention relates to a method and apparatus for recording data, a method and apparatus for reproducing data, and a recording medium. More particularly, the invention relates to a method and apparatus for recording data, a method and apparatus for reproducing data, and a recording medium, which allow data to be recorded in a parallel fashion in a short time.

2. Description of the Related Art

The present applicant has proposed, for example in Japanese Unexamined Patent Publication No. 6-131371 (corresponding to U.S. Pat. No. 5,619,570), Japanese Unexamined Patent Publication No. 6-215010, and Japanese Unexamined Patent Publication No. 6-301601 (corresponding to U.S. Pat. No. 5,717,953), a system in which data such as video data, audio data, a character, and/or a computer program (in particular, data in digital form) is supplied from an information supplying apparatus to a portable type user terminal including a recording medium such as a semiconductor memory thereby providing various services.

In this system, a user may carry a user terminal with him/her to a location where an information supplying apparatus is installed to receive data such as audio data. The user may enjoy listening to, for example, music by reproducing the received data on his/her user terminal. In this system, the user can obtain music data without having to buy a CD (Compact Disc) or a magnetic tape on which audio data is recorded. When the user has become tired of that music, he/she may obtain another audio data via the information supplying apparatus and enjoy listening to new music.

The user terminal used in such a system needs high portability. To meet this requirement, it is desirable that the recording medium used in the user terminal be formed of a nonvolatile memory such as a flash memory capable of holding data without needing backup with a battery or the like.

However, the flash memory needs a rather long programming time in the process of actually writing (recording) input data into a data flash memory cell compared with the data inputting time required to input data to be written (recorded). When a greater amount of data is written than can be input at a time to the flash memory, it is required to wait for a period of time equal to or longer than the programming time after inputting data before inputting next data. Because of such a waiting time, it takes a long time to supply data to one user. This causes another user to wait before he/she receives data because the information supplying apparatus is used by a great number of users. Thus, the information supplying apparatus cannot supply data to a large number of users.

To solve the above problem, the present applicant has proposed a technique of reducing the data writing time by writing data in a parallel fashion into a flash memory formed of a plurality of chips (hereinafter, such a technique will be referred to as a parallel recording method).

In the parallel recording method, data is input to one chip of the plurality of flash memory chips, and next data is input to another chip after completion of inputting the previous data. Similarly, following data is input to the memory chip by chip after completion of inputting previous data. This technique allows data to be input to a chip when previous data is being written into another chip. This makes it unnecessary to wait until a programming time associated with one chip has elapsed before starting to input next data to another chip, and thus it becomes possible to reduce the period of time required to write data.

When data is written into, for example, two chips of the plurality of flash memory chips according to the parallel recording method, a piece of data with a predetermined size is first input to one chip (first chip) and another piece of data with the predetermined size is input to the other chip (second chip) after completion of inputting the previous piece of data to the first chip. When inputting of data to the second chip is completed, still another piece of data with the predetermined size is input to the first chip. However, there is a possibility that writing of the previous piece of data with the predetermined size to the fist chip is not completed when another piece of data is tried to be input to the first chip. In this case, data to be input at this time has to wait until the writing of the previous data is completed. This makes it impossible to achieve an effective increase in the writing speed according to the parallel recording method.

In a specific case where the programming time per flash memory chip is nearly equal to but slightly smaller than 3 times the data inputting time, if data is written into four or more flash memory chips according to the parallel recording method, then it is possible to eliminate the waiting time which would other wise arise from the programming time.

Thus, if a user has a flash memory consisting of four or more chips, it is possible to write data without creating a waiting time by writing data into four more chips according to the parallel recording method.

However, in the case where the writing of data according to the parallel recording method is performed for four or more particular chips arbitrarily selected by a user, there is a possibility that a large amount of data is recorded preferentially in particular one or more chips and, as a result of such preferential writing, the number of flash memory chips available for recording data can drop to three or less. In this case, it is no longer able to write data into four or more flash memory chips according to the parallel recording method, and thus a waiting time associated with the programming time is required. As a result, an effective increase in the writing speed according to the parallel recording method cannot be achieved.

In view of the above, it is an object of the present invention to provide a technique of achieving a maximum increase in the writing speed according to the parallel recording method.

SUMMARY OF THE INVENTION

According to an aspect of the invention, there is provided a recording apparatus for recording data in a parallel fashion in a recording area of a recording medium, the recording area being managed in units of predetermined blocks, the recording apparatus comprising: construction means for constructing one or more parallel block sets each consisting of one or more blocks the number of which is determined in accordance with a minimum number of blocks which allows a waiting time to become minimum in the process of recording the data in the parallel fashion into one or more blocks of the recording medium; and recording means for recording the data into the one or more blocks of the one or more parallel block sets.

According to another aspect of the invention, there is provided a recording method for recording data in a parallel fashion in a recording area of a recording medium, the recording area being managed in units of predetermined blocks, the method comprising the steps of: constructing one or more parallel block sets each consisting of one or more blocks the number of which is determined in accordance with a minimum number of blocks which allows a waiting time to become minimum in the process of recording the data in the parallel fashion into one or more blocks of the recording medium; and recording the data into the one or more blocks of the one or more parallel block sets.

According to another aspect of the invention, there is provided a recording medium for recording data in a parallel fashion in a recording area which is managed in units of predetermined blocks, wherein one or more parallel block sets are constructed which consist of one or more blocks the number of which is determined in accordance with a minimum number of blocks which allows a waiting time to become minimum in the process of recording data in the parallel fashion into the one or more blocks of the recording medium, and the data is recorded in the parallel fashion in the one or more blocks of the one or more parallel block sets.

According to still another aspect of the invention, there is provided a recording medium for recording data in a parallel fashion in a recording area which is managed in units of predetermined blocks, wherein the minimum number of blocks which allows a waiting time to become minimum in the process of recording the data in the parallel fashion into one or more blocks or information required to determine the minimum number of blocks is recorded on the recording medium.

According to still another aspect of the invention, there is provided a reproducing apparatus for reproducing data from a recording medium, the data being recorded in a parallel fashion in a recording area of the recording medium, the recording area being managed in units of predetermined blocks, the reproducing apparatus comprising reading means for reading the data from the recording medium wherein the data is recorded in such a manner that one or more parallel block sets are constructed which consist of one or more blocks the number of which is determined in accordance with a minimum number of blocks which allows a waiting time to become minimum in the process of recording the data in the parallel fashion into said one or more blocks of the recording medium, and the data is recorded in the parallel fashion in the one or more blocks of the one or more parallel block sets.

According to still another aspect of the invention, there is provided a reproducing method for reproducing data from a recording medium, the data being recorded in a parallel fashion in a recording area of the recording medium, the recording area being managed in units of predetermined blocks, the method comprising the step of reading the data from the recording medium wherein the data is recorded on the recording medium in such a manner that one or more parallel block sets are constructed which consist of one or more blocks the number of which is determined in accordance with a minimum number of blocks which allows a waiting time to become minimum in the process of recording the data in the parallel fashion into the one or more blocks of the recording medium, and the data is recorded in the parallel fashion in the one or more blocks of the one or more parallel block sets.

According to still another aspect of the invention, there is provided a recording apparatus for recording data in a parallel fashion in a plurality of recording areas of a recording medium, the plurality of recording areas being managed in units of predetermined blocks, the recording apparatus comprising: construction means for constructing one or more parallel block sets each consisting of one or more blocks used to record the data, in such a manner as not to create a significant difference in the size of a writable area available for recording data among the plurality of recording areas; and recording means for recording the data into the one or more blocks of the one or more parallel block sets.

According to still another aspect of the invention, there is provided a recording method for recording data in a parallel fashion in a plurality of recording areas of a recording medium, the plurality of recording areas being managed in units of predetermined blocks, the method comprising the steps of: constructing one or more parallel block sets each consisting of one or more blocks used to record the data, in such a manner as not to create a significant difference in the size of a writable area available for recording data among the plurality of recording areas; and recording the data into the one or more blocks of the one or more parallel block sets.

According to still another aspect of the invention, there is provided a recording medium for recording data in a parallel fashion in a plurality of recording areas which are managed in units of predetermined blocks, wherein the data is recorded in such a manner that one or more parallel block sets each consisting of one or more blocks used to record the data are constructed in such a manner as not to create a significant difference in the size of a writable area available for recording data among the plurality of recording areas, and the data is recorded in the parallel fashion in the one or more blocks of the one or more parallel block sets.

According to still another aspect of the invention, there is provided a reproducing apparatus for reproducing data from a recording medium, the data being recorded in a parallel fashion in a plurality of recording areas of the recording medium, the plurality of recording areas being managed in units of predetermined blocks, the reproducing apparatus comprising reading means for reading data from said recording medium on which said data is recorded in such a manner that one or more parallel block sets each consisting of one or more blocks used to record the data are constructed in such a manner as not to create a significant difference in the size of a writable area available for recording data among said plurality of recording areas, and said data is recorded in the parallel fashion in the one or more blocks of the one or more parallel block sets.

According to still another aspect of the invention, there is provided a reproducing method for reproducing data from a recording medium, the data being recorded in a parallel fashion in a plurality of recording areas of the recording medium, the plurality of recording areas being managed in units of predetermined blocks, the method comprising the step of reading data from said recording medium on which the data is recorded in such a manner that one or more parallel block sets each consisting of one or more blocks used to record the data are constructed in such a manner as not to create a significant difference in the size of a writable area available for recording data among the plurality of recording areas, and the data is recorded in the parallel fashion in the one or more blocks of the one or more parallel block sets.

BRIEF DESCRIPTION OF THE DRAWINGS

FIGS. 3A and 3B are schematic diagrams illustrating a method of recording data in a parallel fashion;

DESCRIPTION OF THE PREFERRED EMBODIMENT

First, the parallel recording method on which the present invention is based is described. The parallel recording method is disclosed, for example, in Japanese Unexamined Patent Publication No. 11-7408 (corresponding to U.S. patent application Ser. No. 09/065630 filed Apr. 24, 1998, and European Patent No. 0874368) and thus the description is given herein in a brief fashion. Note that although the technique disclosed in Japanese Unexamined Patent Publication No. 11-7408 is applied to a recording medium in which writing is performed in units of pages and deleting is performed in units of blocks wherein one block is greater in size than one page, the present invention is not limited to such a recording medium.

Figure 1:
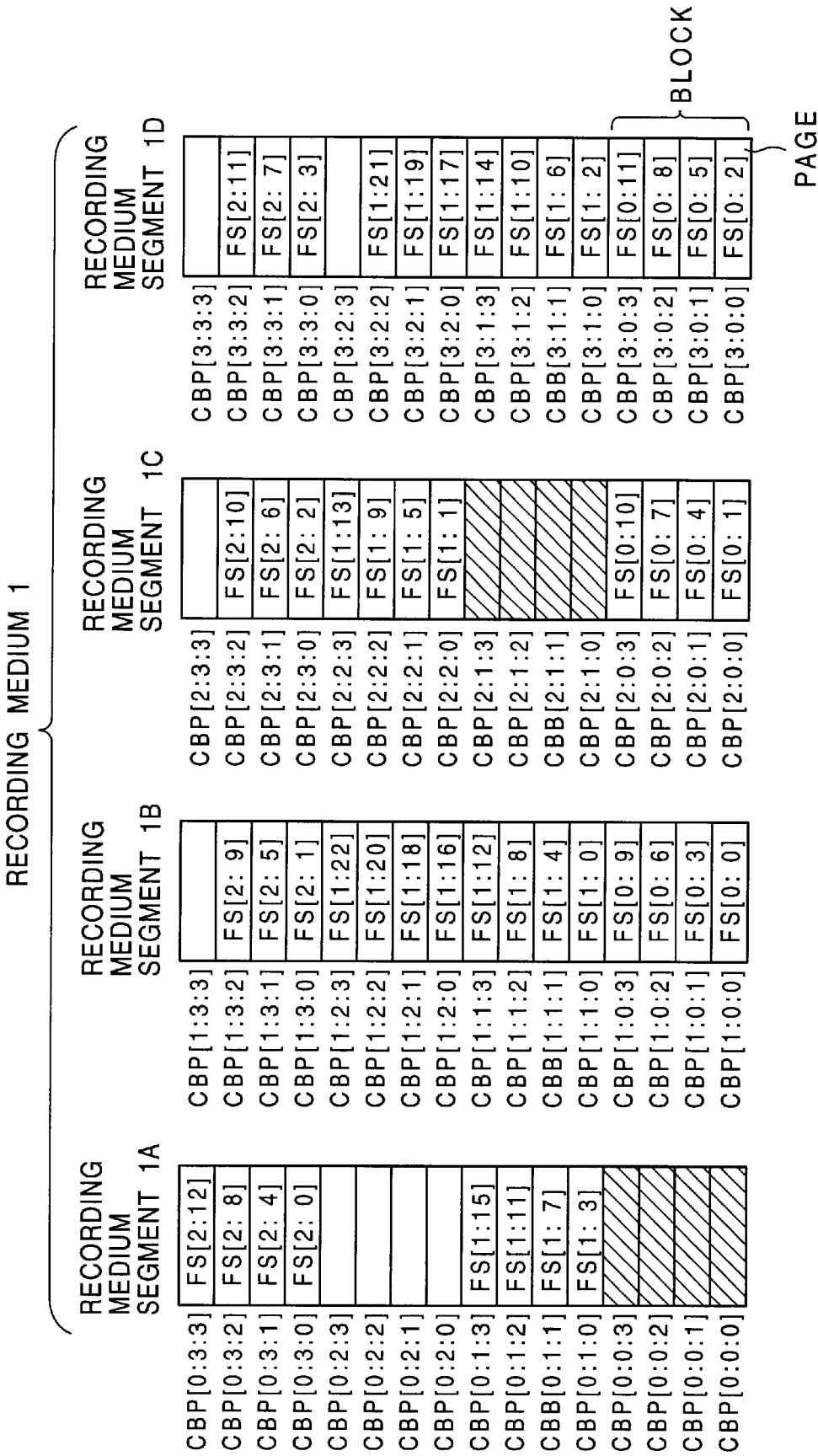
FIG. 1 is a schematic diagram illustrating a method of recording data in a parallel fashion.

FIG. 1 illustrates an example of a configuration of a recording medium on which data is recorded according to the parallel recording method.

In the specific example shown in FIG. 1, the recording medium 1 consists of four recording medium segments 1A–1D. Each of the recording medium segments 1A–1D basically corresponds to, for example, one memory chip. Alternatively, the recording area of one recording medium may be divided into four recording areas and they may be assigned to the recording medium segments 1A–1D, respectively.

The recording medium segment 1A consists of, for example, 16 pages each consisting of 512 bytes. In the present embodiment, one block is formed of 4 pages and thus the recording medium segment 1A consists of 4 blocks (=16 pages/4 pages). The remaining recording medium segments 1B–1D are also formed in a similar fashion.

Herein, the "block" is a unit in which data is deleted from the recording medium and the "page" is a unit in which data is written (recorded) on the recording medium.

In the present embodiment, the physical address of the recording medium 1 is represented as follows.

That is, the physical address is represented by three parameters: the chip number c (Chip), the block number b (Block), and the page number p (Page). The chip number c indicates a particular one of the recording medium segments 1A–1D. More specifically, the recording medium segments 1A–1D are represented by C[0] to C[3], respectively.

The block number b indicates a particular block in each of the recording medium segments 1A–1D. For example, the first to fourth blocks as counted from the bottom of each of the recording medium segments 1A–1D are represented by B[0] to B[3], respectively. Thus, using a chip number c and a block number b, the bottom block of the recording medium segment 1A is represented as CB[0:0]. Similarly, the second block from the bottom of the recording medium segment 1A is represented as CB[0:1], the third block from the bottom is represented as CB[0:2], and the block at the top is represented as CB[0:3]. Similarly, the first to fourth blocks as counted from the bottom of the recording medium segment 1B are represented as CB[1:0] to CB[1:3], respectively, the first to fourth blocks as counted from the bottom of the recording medium segment 1C are represented as CB[2:0] to CB[2:3], respectively, and the first to fourth blocks as counted from the bottom of the recording medium segment 1D are represented as CB[3:0] to CB[3:3], respectively.

The page number p indicates a particular page of each block. More specifically, the first to fourth pages as counted from the bottom of each block is represented as P[0] to P[3], respectively. Thus, using a chip number c, a block number b, and a page number p, the bottom page of the bottom block of the recording medium segment 1A is represented as CBP[0:0:0]. Similarly, the second page as counted from the bottom of the bottom block of the recording medium segment 1A is represented as CB[0:0:1], the third page as counted from the bottom of that block is represented as CB[0:0:2], and the page at the top of that block is represented as CB[0:0:3]. The pages of the remaining blocks of the recording medium segment 1A and also pages of blocks of the other recording medium segments 1B to 1D are represented in a similar manner.

Herein, if the recording medium segments 1A–1D are called first to fourth chips, respectively, then the pth page as counted from the bottom in the bth block as counted from the bottom of the cth chip is represented as CBP[c-1:b-1:p-1].

Herein, one page consists of 512 bytes so as to easily handle the FAT (File Allocation Table) system in which one sector consists of 512 bytes. (However, the size of one page is not limited to 512 bytes.)

In FIG. 1, symbols FS[f:s] represented in pages of the recording medium segments 1A–1D are used to indicate data of files recorded on the recording medium 1 wherein "f" denotes a file number indicating a particular file and "s" denotes a sector number indicating a particular sector. Thus, in the specific example shown in FIG. 1, for example, in the page at the top of the recording medium segment 1A (the page indicated by a physical address CBP[0:3:3]), data FS[2:12] specified by a file number of 2 and a sector number of 12 is recorded. In the page at the bottom of the recording medium segment 1D (page represented by a physical address CBP[3:0:0]), data FS[0:2] specified by a file number of 0 and a sector number of 2 is recorded.

In FIG. 1 (and also in FIGS. 4 to 6), shaded parts represent parts (blocks) incapable of writing data therein (or blocks disabled to write data therein) at a particular point of time. The shaded parts may include a block damaged by a production failure or damaged after a great number of rewriting operations (hereinafter such a block will also be referred to as an invalid block) and a block allocated as a so-called system area or as a spare area (hereinafter such a block will also be referred to as a system block).

Figure 2:
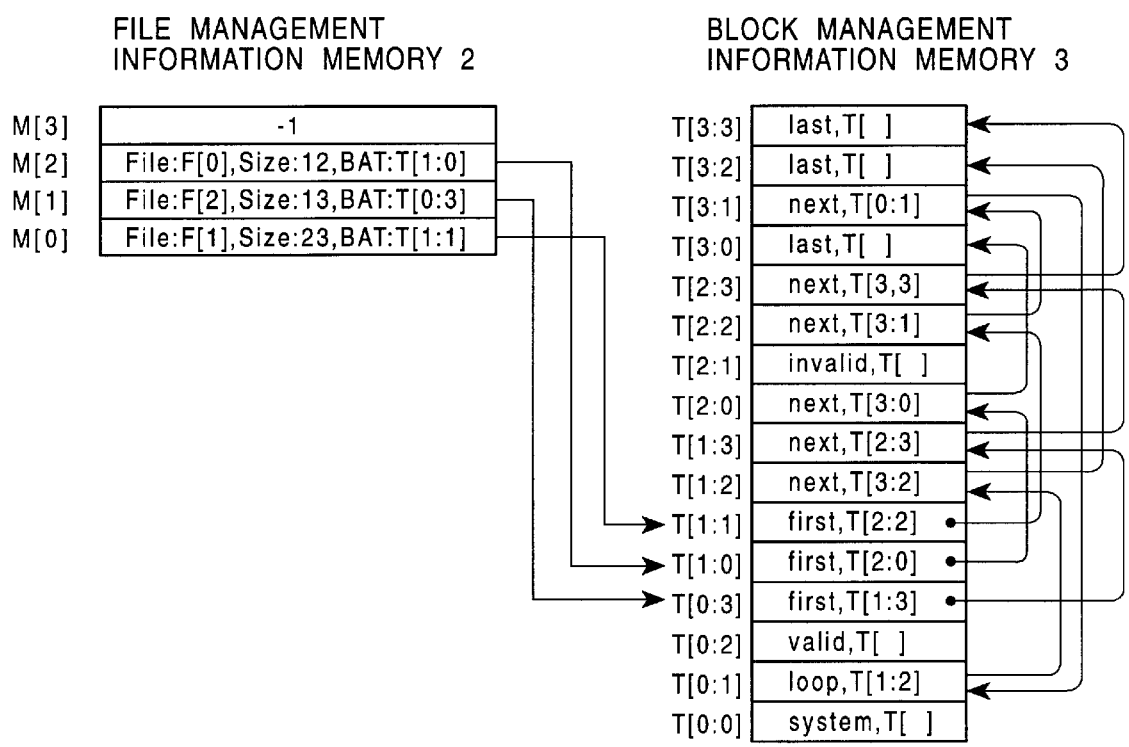
FIG. 2 is a schematic diagram illustrating file management information and block management information.

The data recorded on the recording medium 1 shown in FIG. 1 is managed in units of files and also in units of blocks, as shown in FIG. 2.

FIG. 2 illustrates an example of a configuration of a file management information memory 2 for storing file management information used to manage the data stored on the recording medium 1 in units of files and also illustrates an example of a configuration of a block management information memory 3 for storing block management information used to manage data in units of blocks.

In FIG. 2, the file management information memory 2 has entries corresponding to four physical addresses M[0] to M[3], respectively. One entry stores file management information associated with one file. Therefore, in the specific example shown in FIG. 2, file management information associated with at most four files can be stored (the file management information memory 2 may also be constructed so as to store file management information associated with files the number of which is different from 4).

Herein, the file management information consists of information specifying a file (file name, for example), information indicating the size of that file, and a pointer pointing to an entry of the block management information memory 3 in which associated block management information is stored. More specifically, in the example shown in FIG. 2, the file name is represented by F[n] (n represents, for example, the file number thereof), the size is represented by the number of sectors (equal to the number of pages in this specific embodiment), the pointer (BAT) pointing to the entry is represented by a physical address T[c:b] of the block management information memory 3 wherein c denotes a chip number and b denotes a block number.

From the file management information stored in the file management information memory 2 shown in FIG. 2, the following can be recognized.

First, three files specified by file names F[0] to F[2] are recorded on the recording medium 1 in the logical order, F[1], F[2], and F[0]. Second, the sizes of files F[0] to F[2] are 12, 23, and 13 sectors (pages), respectively. Third, the blocks at the top of the recording medium 1 where the respective files F[0] to F[2] are recorded are blocks CB[1:0], CB[1:1], and CB[0:3] corresponding to the entries of the block management information memory 3 specified by physical addresses T[1:0], T[1:1], and T[0:3].

In FIG. 2, the physical address M[3] of the file management information memory 2 stores a value of −1 which indicates that no valid file management information is stored therein.

The block management information memory 3 has entries corresponding to the blocks of the recording medium 1. In this specific example, there are 16 entries in total corresponding to four blocks of each of four recording medium segments 1A–1D, respectively. In each entry, block management information associated with the corresponding block is stored.

Herein, the physical address of each entry of the block management information memory 3 is represented by T[c:b] using the chip number c of a chip including a block corresponding to the entry and the block number b of the corresponding block. In other words, in the block management information memory 3, the entry whose physical address is represented by T [c:b] stores block management information associated with a block whose block number is b in one of recording medium segments 1A–1D whose chip number is c.

More specifically, an entry whose physical address is represented as T[0:0] stores block management information associated with the block (B[0]) at the bottom of the recording medium segment 1A (C[0]). An entry whose physical address is represented as T[0:1] stores block management information associated with the second block (B[1]) from the bottom of the recording medium segment 1A (C[0]). An entry whose physical address is represented as T[0:2] stores block management information associated with the third block (B[2]) from the bottom of the recording medium segment 1A (C[0]). An entry whose physical address is represented as T[0:2] stores block management information associated with the block (B[3]) at the top (the fourth block from the bottom) of the recording medium segment 1A (C[0]). In a similar manner, the other entries store block management information associated with the corresponding blocks. Thus, for example, the entry at the top of the block management information memory 3, that is the entry whose physical address is represented as T[3:3], stores block management information associated with the block (B[3]) at the top of the recording medium segment 1D (C[3]).

Hereinafter, a table containing all block management information stored in the block management information memory 3 will be refereed to as a BAT (block allocation table) and each entry of the BAT stored in the block management information memory 3 will be referred to as a BAT entry.

The block management information of each BAT entry consists of status flags, link information, and other required information.

Herein, seven flags are used as the status flags. They are a valid flag, an invalid flag, a system flag, a first flag, a next flag, a last flag, and a loop flag. The valid flag indicates that the corresponding block is a writable block (a free area (an area in which some data has been already written but which is allowed to be overwritten is also regarded as a free area)). The invalid flag indicates that the corresponding block is invalid. The system flag indicates that the corresponding block is a system block. The first flag indicates that the corresponding block stores first data of a file and the last flag indicates that the corresponding block stores data at the end of the file. The next and loop flags indicate that there is another data following the data stored in the corresponding block (that is, the data following the data stored in the corresponding block is stored in another block). The loop flag also indicates that the last data of a parallel block set which will be described later is stored in the corresponding block (the corresponding block is the last block of the parallel block set).

Link information represents the manner in which blocks of the recording medium segments 1A–1D are linked to each other. That is, the link information includes the physical address of a BAT entry corresponding to a block storing data following data stored in a certain block. Therefore, the link information is written when there is a further block storing data following the data stored in the block corresponding to the BAT entry in which that link information is written, and thus one of the first flag, the next flag, and the loop flag is also written when the link information is written.

In the example shown in FIG. 2, for example, a BAT entry T[1:0] corresponding to a block CB[1:0] stores, as link information, the physical address T[2:0] of a BAT entry corresponding to a block CB[2:0]. A BAT entry T[2:0] stores, as link information, the physical address T[3:0] of a BAT entry corresponding to a block CB[3:0].

BAT entries T[1:0], T[2:0], T[3:0] store, as a status flag, a first flag, next flag, and a last flag, respectively. Thus, in this specific example, it can be recognized from the link information that blocks CB[1:0]. CB[2:0], and CB[3:0] store data successive in this order and that the blocks CB[1:0] and CB[3:0] store first and last data, respectively, of a file. Thus, it can be recognized that the three blocks described above constitute one file.

In the specific example shown in FIG. 2, an entry M[2] of the file management information memory 2 stores a pointer pointing to a BAT entry T[1:0] in which a first flag is stored. Therefore, a file consisting of data stored in blocks CB[1:0], CB[2:0], and CB[3:0] is managed as the third file F[0] by file management information stored in the file management memory 2.

From the file management information and the block management information, it is possible to recognize the status of files stored on the recording medium 1, as described below.

For example, the status of the file F[1] is as follows. From the file management information, it is detected that the file F[1] is stored as a logically first file and that the file F[1] has a size of 23 sectors. Furthermore, from block management information stored in the BAT entries linked from the BAT entry T[1:1], it is possible to detect the recording status of the file F[1] on the recording medium 1.

Furthermore, a BAT entry T[1:1] stores, as link information, T[2:2] which indicates that the BAT entry [1:1] is linked to the BAT entry T[2:2]. On the other hand, the BAT entry T[2:2] stores T[3:3] as link information, a BAT entry T[3:1] stores T[0:1] as link information, the BAT entry T[0:1] stores T[1:2] as link information, and the BAT entry T[1:2] stores T[3:1] as link information. Thus, BAT entries are linked such that T[1:1]→T[2:2]→T[3:1]→T[0:1]→T[1:2]→T[3:2] and the data of the file F[1] is stored in blocks in the order CB[1:1]→CB[2:2]→CB[3:1]→CB[0:1]→CB[1:2]→CB[3:2].

Furthermore, the BAT entry T[1:1] stores a first flag, which indicates that the corresponding block CB[1:1] stores the first data of the file F[1]. The BAT entry T[2:2] linked by the BAT entry T[1:1] stores a next flag, the BAT entry T[3:1] linked by the BAT entry T[2:2] also stores a next flag, and the BAT entry T[0:1] linked by the BAT entry T[3:1] stores a loop flag. This indicates that data of the file F[1] is stored in a parallel fashion in blocks CB[1:1], CB[2:2], CB[3:], and CB[0:1] corresponding to BAT entries T[1:1], T[2:2], T[3:1], and T[0:1], respectively. That is, four blocks CB[1:1], CB[2:2], CB[3:1], and CB[0:1] form a set of parallel blocks.

On the other hand, a BAT entry T[1:2] linked by a BAT entry T[0:1] stores a next flag, and a BAT entry T[3:2] linked by the BAT entry T[1:2] stores a last flag. This indicates that blocks CB[1:2] and CB[3:2] corresponding to the BAT entries T[1:2] and T[3:2] also store data of the file F[1] in a parallel fashion. That is, two blocks CB[1:2] and CB[3:2] form a set of parallel blocks. It is also indicated that the last data of the file F[1] is stored in the block CB[3:2] corresponding to the BAT entry T[3:2] in which the last flag is stored.

Although not described above, in the case where a first flag together with the physical address of a BAT entry is stored, it is indicated that the first data of a file is stored in a block corresponding to the BAT entry in which the first flag is stored and also that there is data following the first data. On the other hand, the last flag indicates that the last data of a file is stored in a block corresponding to a BAT entry in which the last flag is stored and also that there is no further block following that.

In the parallel recording method, one block is selected from one of the recording medium segments 1A–1D, or one block is selected from each of two or more recording medium segments 1A–1D (basically, one block is selected from each of a plurality of recording medium segments) and one set of parallel blocks is built by the selected blocks. To facilitate understanding, let us assume here that one block is selected from each of the recording medium segments 1A–1D. More specifically, for example blocks CB[0:1], CB[1:1], CB[2:2], and CB[3:1] are selected from the recording medium segments 1A–1D, respectively, and one set of parallel blocks is formed by these four blocks. After that, data is written, in a parallel fashion, into the set of parallel blocks consisting of blocks CB[0:1], CB[1:1], CB[2:2], and CB[3:1].

Furthermore, let us also assume that the file to be written is F[1]. The first sector FS[1:0] of the file F[1] is input to, for example, the recording medium segment 1B and written into its one block CB[1:1] which is one member of the set of parallel blocks. As described earlier, writing of data into the recording medium 1 is performed in units of pages, and thus the first sector FS[1:0] is written into a page at the bottom of the block CB[0:1], that is, into a page CBP[1:1:0].

After inputting the first sector FS[1:0] of the file F[1] to the recording medium segment 1B, the second sector FS[1:1] following that is input to, for example, the recording medium segment 1C and written into its one block CB[2:2] which is another member of the set of parallel blocks (FIG. 1). Also in this case as in the first sector, the second sector FS[1:1] is written into a page at the bottom of the block CB[2:2], that is, into a page CBP[2:2:0].

After inputting the second sector FS[1:1] of the file F[1] to the recording medium segment 1C, the third sector FS[1:2] following that is input, for example, to the recording medium segment 1D and written into its one block CB[3:1] which is another member of the set of parallel blocks (FIG. 1). Also in this case as in the first and second sectors, the third sector FS[1:2] is written into a page at the bottom of the block CB[3:1], that is, into a page CBP[3:1:0].

After inputting the third sector FS[1:2] of the file F[1] to the recording medium segment 1D, the fourth sector FS[1:3] following that is input, for example, to the recording medium segment 1A and written into its one block CB[0:1] which is one member of the set of parallel blocks (FIG. 1). Also in this case as in the above-described sectors, the fourth sector FS[1:3] is written into a page at the bottom of the block CB[0:1], that is, into a page CBP[0:1:0].

After inputting the fourth sector FS[1:3] of the file F[1] to the recording medium segment 1A, the fifth sector FS[1:4] following that is input again to the recording medium segment 1B and written into its one block CB[1:1] which is one member of the set of parallel blocks (FIG. 1). In this case, the fifth sector FS[1:4] is written into the second page, as counted from the bottom, of the block CB[1:1], that is, into a page CBP[1:1:1].

After that, the remaining data of the file F[1] is written page by page in a similar manner into the blocks CB[0:1], CB[1:1], CB[2:2], and CB[3:1] constituting the set of parallel blocks. That is, data is written in an interleaved fashion. In the case where the amount of data of the file F[1] is greater than 4 blocks, after completion of writing data into the blocks CB[0:1], CB[1:1], CB[2:2], CB[3:1], the remaining data (sectors) is written into another set of parallel blocks.

By employing the parallel recording method described above, it becomes possible to reduce or completely delete a waiting time which can occur when the recording medium 1 is formed of a flash memory or the like which needs a rather long programming time compared with a data inputting time.

Herein, the data inputting time and the programming time associated with each of the recording medium segments 1A–1D are denoted by $t_{input}$ and $t_{prog}$, respectively. In the case where data is written only in the recording medium segment 1A without performing interleaving, inputting of the first sector to the recording medium segment 1A (C[0]) is started at time t0 as shown in FIG. 3A and the inputting of that sector is completed at time t1 when a data inputting time $t_{input}$ has elapsed since t0. After that, the writing of the first sector which has been input is started. The writing of the first sector is completed at time t4' when a programming time $t_{prog}$ has elapsed. Inputting of the second sector to the recording medium segment 1A (C[0]) is then started, and data is written into the recording medium segment 1A in a similar manner.

In the case where data is written in the above-described manner without interleaving, it is required to start input data when the programming time $t_{prog}$ has elapsed after completion of inputting previous data. Therefore, it takes a time equal to the data inputting time $t_{input}$ plus the programming time $t_{prog}$ to write one sector. When, for example, six pages of data are written without interleaving, it takes six times the time required to write one sector, that is, Ts=6×($t_{input}$+$t_{prog}$), as shown in FIG. 3A.

In contrast, in the case where data is written in an interleaving fashion into a set of four parallel blocks selected from the respective recording medium segments 1A–1D (C[0] to C[3]) in the order, for example, 1A, 1B, 1C, and 1D, inputting of the first sector for example to the recording medium segment 1A (C[0]) is started at time t0 as shown in FIG. 3B, and the inputting of that sector is completed at time t1 when a data inputting time $t_{input}$ has elapsed since t0. After that, the writing of the already-input first sector into the recording medium segment 1A is started and completed at time t4' when a programming time $t_{prog}$ has elapsed. Thus, the operation for the recording medium segment 1A is performed in the same manner as the operation described above with reference to FIG. 3A.

However, for the recording medium segment 1B (C[1]), it is possible to start inputting of the second sector at the time when the inputting of the first sector to the recording medium segment 1A is completed. That is, the inputting of the second sector to the recording medium segment 1B is started at time t1. At time t2 when a data inputting time $t_{input}$ has elapsed since t1, the inputting of that sector is completed and the writing of that sector into the recording medium segment 1B is started. If the programming time $t_{prog}$ has elapsed since t2, the writing of the second sector into the recording medium segment 1B is completed.

Similarly, inputting of the third sector to the recording medium segment 1C (C[2]) can be started at time t2 at which the inputting of the second sector to the recording medium segment 1B is completed. Furthermore, inputting of the fourth sector to the recording medium segment 1D (C[3]) can be started at time t3 at which the data inputting time $t_{input}$ has elapsed since the start of the inputting of the third sector.

It is assumed here that the programming time $t_{prog}$ is slightly shorter, for example, than 3 times the data inputting time $t_{input}$. In this case, when the inputting of the fourth sector is completed at time t4 after the data inputting time $t_{input}$ has elapsed since the inputting of the fourth sector was started at time t3, some time has already passed since time t4' at which the writing of the first sector into the recording medium segment 1A (C[0]) was completed. Therefore, inputting of the fifth sector to the recording medium segment 1A (C[0]) can be started at time t4 at which the inputting of the fourth sector to the recording medium segment 1D is completed. Similarly, inputting of the sixth sector to the recording medium segment 1B (C[1]) can be started at time t5 at which the inputting of the fifth sector to the recording medium segment 1A is completed (after the data inputting time $t_{input}$ has elapsed since time t4).

Therefore, in the embodiment shown in FIG. 3 in which data is written in the interleaving fashion, the waiting time caused by the programming time $t_{prog}$ becomes zero. Therefore, for example, writing of 6 page of data can be performed in a time period Tp (6×$t_{input}$+$t_{prog}$) which is shorter than the time period Ts required when the writing is performed without interleaving as shown in FIG. 3A. That is, the parallel recording method allows data to be written at a high speed even if the recording medium 1 needs a rather long programming time compared with the data inputting time.

The manner in which data is recorded on the recording medium 1 according to the parallel recording method has been described above with reference to FIGS. 1 and 2, wherein FIG. 1 illustrates the status of the recording medium 1, and FIG. 2 illustrates the status of the file management information memory 2 and the block management information memory 3. The data recorded in the above-described manner can be read, for example, in a manner as described below.

In the case where a file F[0] is read, file management information associated with the file F[0] is acquired by accessing the file management information memory 2 (FIG. 2). From the file management information associated with the file F[0], the physical address of a BAT entry is detected which stores information pointing to a block in which the first data of the file F[0] is stored. In the specific example shown in FIG. 2, T[1:0] is detected as the physical address.

As described above, the BAT entry T[1:0] points to the block CB[1:0]. Furthermore, in the block management information memory 3, the BAT entry T[1:0] corresponding to the block CB[1:0] also stores, as link information, the physical address T[2:0] of a BAT entry corresponding to a block CB[2:0]. On the other hand, the BAT entry T[2:0] stores, as link information, the physical address T[3:0] of a BAT entry corresponding to a block CB[3:0].

The BAT entries T[1:0], T[2:0], and T[3:0] also store, as status flags, a first flag, a next flag, and a last flag, respectively. From the above information, it is recognized that data of the file F[0] has been stored in the interleaving fashion in a set of parallel blocks consisting of CB[1:0], CB[2:0], and CB[3:0] and that the data has been stored in the order CB[1:0], CB[2:0], and CB[3:0]. If the set of parallel blocks and the order in which data is stored in the set of parallel block are detected as described above, then the data is read from the set of parallel blocks while performing deinterleaving in the same order as that in which the data was written. From the last flag stored in the BAT entry T[3:3] which manages the block CB[3:0] at the end of a parallel block set, and also from the fact that the size of the file F[0] is 12 sectors (pages), it is detected that the last page CBP[3:0:3] of the block CB[3:0] is the last data of the file F[0]. Thus, when the data at the page CBP[3:0:3] is read, the reading of the file F[0] is completed.

In the example shown in FIG. 3, as described above, the programming time $t_{prog}$ is assumed to be close to but shorter than 3 times the data inputting time $t_{input}$. In this case, the increase in the writing speed achieved by the parallel recording method can be maximized by constructing a set of parallel blocks such that the set includes four or more blocks.

In the case where a parallel block set consisting of three blocks is constructed by selecting one block from each of three recording medium segments, for example, 1A to 1C of the recording medium segments 1A–1D (C[0] to C[3]), inputting of the second sector to the recording medium segment 1B (C[1]) can be started after completion of inputting the first sector to the recording medium segment 1A (C[0]), and inputting of the third sector to the recording medium segment 1C (C[2]) can be started after completion of inputting the second sector to the recording medium segment 1B (C[1]), as described above with reference to FIG. 3B. In this case in which the parallel block set consists of three blocks described above, the fourth sector is input to the recording medium segment 1A (C[0]). However, because the inputting of the third sector to the recording medium segment 1C (C[2]) is completed at time t3 before the writing of the first sector into the recording medium segment 1A (C[0]) is completed at time t4', it is required to wait at least a time period t4'–t3 before starting to input the fourth sector to the recording medium segment 1A (C[0]) after completion of the inputting of the third sector.

On the other hand, when a parallel block set consisting of two blocks is constructed by selecting one block from each of two recording medium segments, for example, 1A and 1B of the recording medium segments 1A–1D (C[0] to C[3]), inputting of the second sector to the recording medium segment 1B (C[1]) can be started after completion of inputting the first sector to the recording medium segment 1A (C[0]), as described above with reference to FIG. 3B. In this case in which the parallel block set consists of two blocks described above, the third sector is input to the recording medium segment 1A (C[0]). However, because the inputting of the second sector to the recording medium segment 1B (C[1]) is completed at time t2 before the writing of the first sector into the recording medium segment 1A (C[0]) is completed at time t4', it is required to wait at least a time period t4–t2 (>t4'–t3) before starting to input the third sector to the recording medium segment 1A (C[0]) after completion of the inputting of the second sector.

As can be seen from FIG. 3B, the waiting time t4'–t2 required in the case where the parallel block set consists of two blocks is longer than the waiting time t4'–t3 required in the case where the parallel block set consists of three blocks. This means that the waiting time increases with the reduction in the number of blocks contained in the parallel block set.

As described above, it is desirable that the number of blocks contained in the parallel block set be greater than a predetermined value to achieve a maximum increase in the writing speed by means of the parallel recording method.

Therefore, in the present invention, the number of blocks contained in the parallel block set is limited to values equal to or greater than a minimum number of blocks $I_{min}$ wherein $I_{min}$ is defined as a minimum number of blocks required to achieve a minimum waiting time in the operation of writing data in the parallel fashion into the recording medium 1. More specifically, the number of blocks contained in the parallel block set is limited to values equal to or greater than $I_{min}$ given by the following equation:

$$I_{min} = \text{ceil}(t_{prog}/t_{input}) + 1 \quad (1)$$

where ceil(x) is a function that produces a minimum integer greater than x.

The number of blocks contained in the parallel block set is equal to the number of blocks into which data is written in an interleaving fashion. Thus, hereinafter, the number of blocks will also be called the interleaving number.

In the above-described examples, the blocks constituting the parallel block set are not limited to blocks of particular recording medium segments of the recording medium segments 1A–1D. However, in the case where the parallel block set is constructed by selecting blocks arbitrarily from the recording medium segments 1A–1D, the number of blocks allowed to be written becomes different among the recording medium segments 1A–1D (that is, the free area becomes different among the recording medium segments 1A–1D) during the writing process. This can make it impossible to reduce the recording time in the parallel recording process.

Figure 4:
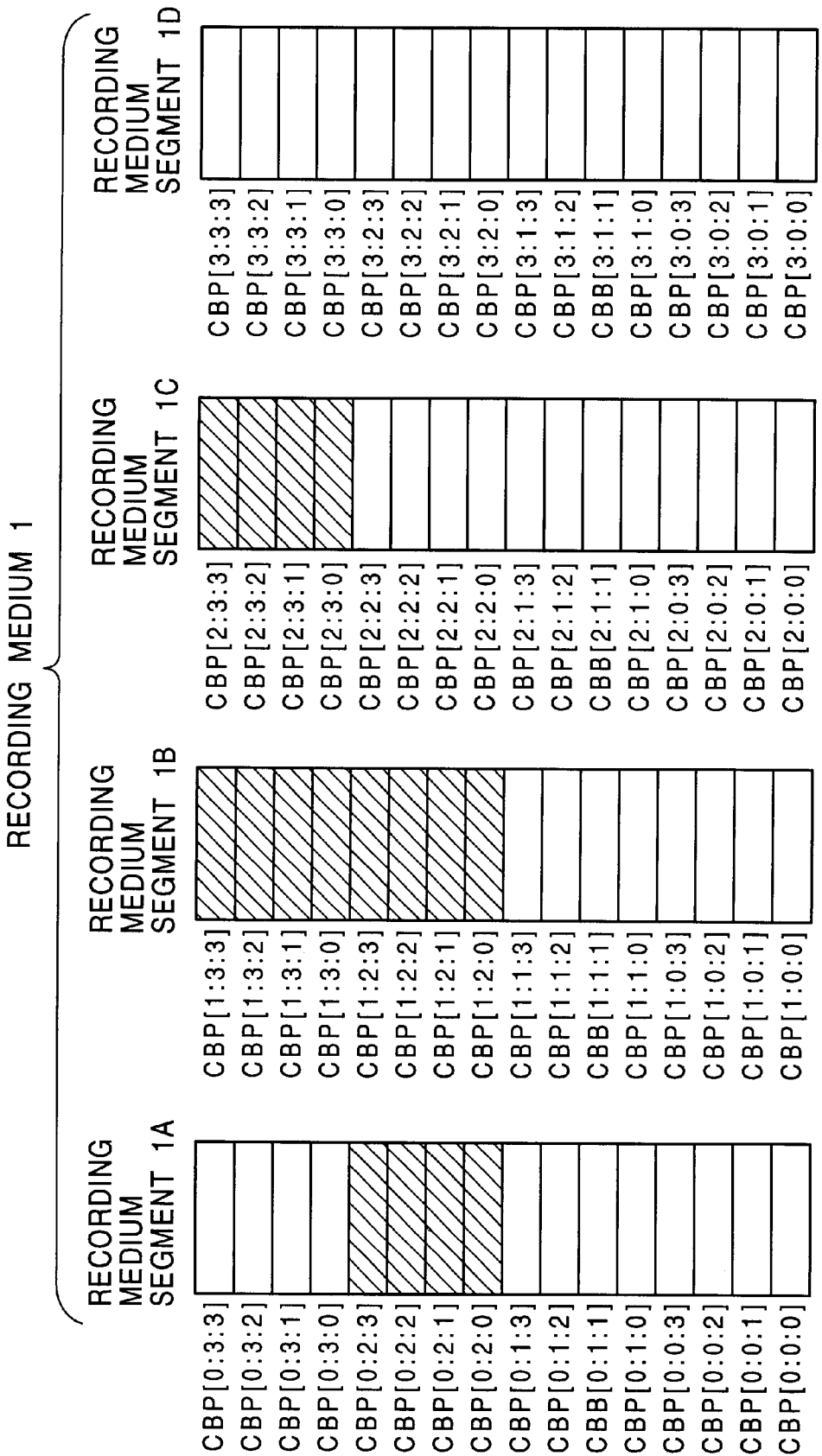
FIG. 4 is a schematic diagram illustrating a problem which can occur in the parallel recording method.

This problem will be described in further detail assuming that data is stored in the recording medium segments 1A–1D as shown in FIG. 4. In FIG. 4, shaded parts represent those blocks in which writing of data is disabled as described earlier with reference to FIG. 1, and no-shaded blocks are allowed to be written.

It is assumed here that first and second files whose data amount is each equal to 6 blocks are further written according to the parallel recording method into the recording medium segments 1A–1D which are currently in the states shown in FIG. 4.

In the case where a parallel block set is constructed such that the parallel block set contains as many blocks as possible without limiting the interleaving number by the minimum number of blocks $I_{min}$, and such that blocks whose location is lower and closer to the leftmost position in FIG. 4 are selected in preference to the other blocks, blocks CB[0:0], CB[1:0], CB[2:0], and CB[3:0] for which writing is allowed are selected from the recording medium segments 1A–1D, respectively, and a first parallel block set is constructed by these blocks. Furthermore, blocks CB[0:1] and CB[1:1] for which writing is allowed are selected from the recording medium segments 1A and 1B, respectively, and a second parallel block set is constructed by these blocks. Then first four blocks of data of the first file are written into the first parallel blocks and the remaining two blocks of data are written into the second parallel blocks.

At the time when the writing of the first file is completed, blocks remaining available for writing of data are a block CB[0:3] in the recording medium segment 1A, blocks CB[2:1] and CB[2:2] in the recording medium segment 1C, and blocks CB[3:1], CB[3:2], and CB[3:3] in the recording medium segment 1D. The recording medium segment 1B has no block remaining available for writing of data.

In this case, therefore, in order to write the second file with a size of 6 blocks, three sets of parallel blocks containing three, two, and one block, respectively, are established.

First, blocks CB[0:3], CB[2:1], CB[3:1] remaining available for writing data are selected from the recording medium segments 1A, 1C, and 1D, respectively, and a first set of parallel blocks is constructed using these three blocks. At this stage, the recording medium segment 1A has no further block available for writing data. Thus, two block CB[2:2] and CB[3:2] remaining available for writing data are selected from the recording medium segments 1C and 1D, respectively, and a second set of parallel blocks is constructed using these two blocks. At this stage, the recording medium segment 1C has no further block available for writing data. Thus, one block CB[3:3] still remaining available for writing data is selected from the recording medium 1D, and a third parallel block set is constructed using this one block.

The data of the second file is written sequentially into three sets of parallel blocks constructed in the above-described manner using three, two, and one block, respectively.

As described above, the waiting time generally increases with the reduction in the number of blocks contained in a set of parallel blocks. On the other hand, when a file is written into a set of parallel blocks, the time required to select parallel blocks and manage them increases with the number of blocks contained in the set of parallel blocks, and thus the time required to write the file increases.

Therefore, in the case where data with a size of 6 blocks is written into the recording medium 1 consisting of four recording medium segments 1A–1D, it is desirable, from the point of view of reducing the recording time, that only two sets of parallel blocks be constructed and that each set contains parallel blocks the number of which is equal to or greater than the minim number of blocks $I_{min}$. When the recording medium 1 has such a property associated with the relationship between the data inputting time $t_{input}$ and the programming time $t_{prog}$ as shown in FIG. 3, if three parallel block sets containing three, two, and one block, respectively, are constructed for use in writing the second file with the side of 6 blocks, then it becomes impossible to effectively reduce the recording time according to the parallel recording method.

The reason why three parallel block sets, rather than two parallel block sets for the first file, are constructed when the second file is recorded, and why a reduction in the number of blocks contained in one or more parallel block sets occurs is that there is a difference in the number of writable blocks among the recording medium segments 1A–1D.

In the specific example described above with reference to FIG. 4, at the time when the writing of the first file is completed, the recording medium segment 1D has three blocks CB[3:1], CB[3:2], and CB[3:3] remaining available for writing data, however, no blocks available for writing data remain in the recording medium segment 1B. As a result, it becomes impossible to select a block from the recording medium segment 1B and thus it becomes impossible to construct a set of parallel blocks in a manner that allows a reduction in the recording time.

To avoid the above problem, the interleaving number is limited to values equal to or greater than the minim number of blocks $I_{min}$ defined by equation (1), the selection of blocks to construct a set of parallel blocks is performed in such a manner that large differences in the number of blocks available for writing data are not produced among the recording medium segments 1A–1D.

The parallel recording method in which the interleaving number is limited to values equal to or greater than the minimum number of blocks $I_{min}$ and parallel block sets are constructed in such a manner as not creating a significant difference in the number of writable blocks over the recording medium 1 is called here the new parallel recording method, which will be described in further detail below.

Figure 5A:
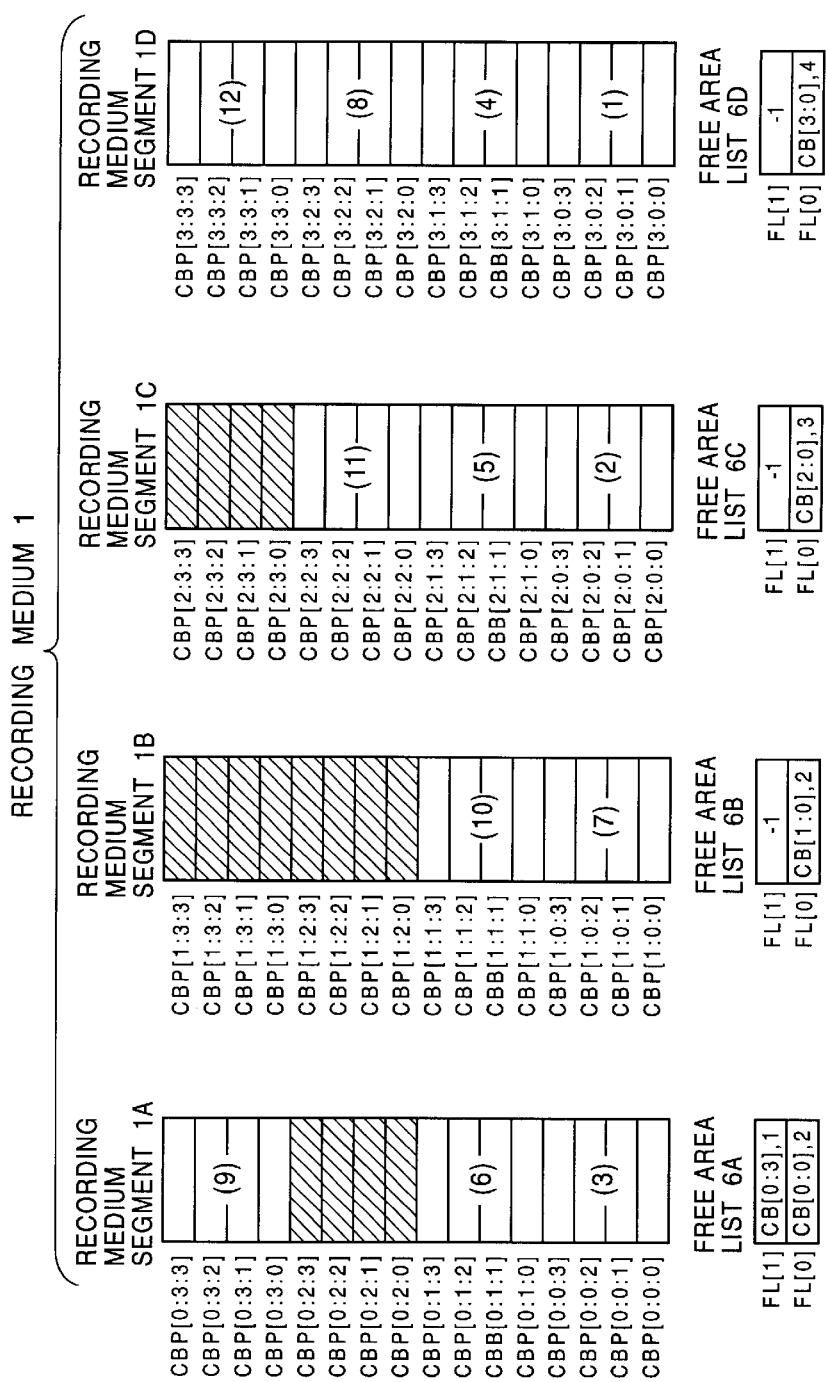
FIGS. 5A and 5B are schematic diagrams illustrating a new parallel recording method.

In this parallel recording method, as described in FIG. 5A, each area containing such blocks which are physically successive and available for writing data is treated as one free area and areas available for writing data are managed on a free area-by-free area basis, as shown in FIG. 5A. To perform such management, a free area list is produced for each of the recording medium segments 1A–1D.

In FIG. 5A, free area lists 6A to 6D are provided for managing free areas of the recording medium segments 1A–1D, wherein each entry stores the address of a first block of a free area available for writing data and also stores the number of blocks of that free area.

More specifically, an entry FL[0] of the free area list 6A associated with the recording medium segment 1A stores "CB[0:0], 2" which indicates that the recording medium segment 1A has a free area containing two blocks starting at a block CB[0:0]. Similarly, an entry FL[1] of the free area list 6A stores "CB[0:3], 1" which indicates that the recording medium segment 1A also has a free area containing one block starting at a block CB[0:3]. Thus, the free area list 6A indicates that three blocks CB[0:0], CB[0:1], and CB[0:3] are available for writing data in the recording medium segment 1A.

On the other hand, an entry FL[0] of the free area list 6B associated with the recording medium segment 1B stores "CB[1:0], 2" which indicates that the recording medium segment 1B has a free area containing two blocks starting at a block CB[1:0]. An entry FL[1] of the free area list 6B stores "−1" which indicates that the content of the entry is invalid. Thus, the free area list 6B indicates that two blocks CB[1:0] and CB[1:1] are available for writing data in the recording medium segment 1B.

Similarly, the free area list 6C associated with the recording medium segment 1C indicates that three blocks CB[2:0], CB[2:1], and CB[2:2] are available for writing data in the recording medium segment 1C, and the free area list 6D associated with the recording medium segment ID indicates that four blocks CB[3:0] to CB[3:3] are available for writing data in the recording medium segment 1D.

By describing the address of a first block of a free area and the number of blocks of that free area in each entry of the free area lists 6A to 6D, it becomes possible to detect blocks which area available for writing data in the respective recording medium segments 1A–1D and also possible to detect the number of free areas of the respective recording medium segments 1A–1D by counting the number of valid entries (entries having a value other than −1).

In the new parallel recording method, a set of parallel blocks is constructed while managing the free areas in the above-described manner and data is written in a parallel fashion into the set of parallel blocks, as will be described detail below.

First, the minimum number of blocks $I_{min}$ is calculated according to equation (1). Alternatively, the minimum number of blocks $I_{min}$ may be calculated in advance from the data inputting time $t_{input}$ and the programming time $t_{prog}$ which can be determined if the type of the recording medium 1 is given, and the calculated minimum number of blocks $I_{min}$ may be stored in the recording medium 1 in advance.

After calculating the minimum number of blocks $I_{min}$, the interleaving number $I_i$ indicating the number of blocks contained in a set of parallel blocks for use in storing a file (data) is calculated on the basis of the minimum number of blocks $I_{min}$ so that the following equation is satisfied:

$$L_f = \Sigma I_i \quad (2)$$

$$I_{min} \leq I_i \leq N \quad (3)$$

wherein $L_f$ denotes the minimum required number of blocks required to store a file to be written (hereinafter such a number will be referred to as the minimum required number of blocks). $L_f$ is given by $L_f=\text{ceil}(C_f/C_b)$ where $C_f$ denotes the size of data contained in the file to be written and $C_b$ denotes the size (capacity) of each block. N denotes the number of those of the recording medium segments 1A–1D of the recording medium 1 which have an area available for writing data. In the present embodiment, the maximum possible value for N is 4. Suffix "i" is used to specify a particular set of parallel blocks for storing the file to be written, wherein i has an integer value in the range $1 \leq i \leq L_c$. $L_c$ denotes the total number of sets of parallel blocks used to store the file to be written. In the example described above with reference to FIG. 4, two sets of parallel blocks, that is, first and second sets of parallel blocks, are used to store the first file and thus $L_c$ for the first file is 2. On the other hand, three sets of parallel blocks, that is, first through third sets of parallel blocks are used to store the second file, and thus $L_c$ for the second file is 3. $I_i$ denotes the number of blocks (interleaving number) contained in an ith set of parallel blocks. Furthermore, $\Sigma$ in equation (2) represents a summation with respect to i (summation of $I_i$ for all i=1, ..., $L_c$).

By way of example, if the data inputting time $t_{input}$ and the programming time $t_{prog}$ are equal to 60 µsec and 100 µsec, respectively, then the minimum number of blocks $I_{min}$ is determined to be 3 according to equation (1). If the minimum required number of blocks $L_f$ required to store a file to be written is, for example, 4, then it is determined from equations (2) and (3) that $L_c=1$ and $I_{b=4}$ and thus one set of parallel blocks consisting of four blocks is constructed. In the above calculation, N is assumed to be 4, as described earlier.

In the example described above, if the value of $L_c$ is determined to be 2 and if two sets of parallel blocks are constructed, then the following problem occurs. That is, to construct two sets of parallel blocks used to store a file with a minimum required number of blocks $L_f=4$, it is required to divide four blocks into two groups containing one and three blocks, respectively, or into two groups both containing two blocks. If four blocks are divided into two groups one of which contains one block and the other contains three blocks, that is, if two sets of parallel blocks are constructed such that one set of parallel blocks contains one block and the other set of parallel blocks contains three blocks, then the set of parallel blocks containing one block does not meet the requirement regarding the interleaving number $I_i$ (=1) defined by equation (3) although the set of parallel blocks containing three blocks meets the requirement regarding the interleaving number $I_i$ (=3) defined by equation (3). In the case where two sets of parallel blocks are constructed such that each set contains two blocks, neither set of parallel blocks meets requirement regarding the interleaving number $I_i$ (=2) defined by equation (3).

For the above reason, when N=4, $I_{min}$=3, and $L_f$=4, one set of parallel blocks containing four blocks is constructed so that equations (2) and (3) are satisfied.

On the other hand, in the case where N=4, $I_{min}$=3, and $L_f$=5, the minimum required number of blocks $L_f$ (=5) is greater than the number of recording medium segments 1A–1D of the recording medium 1 (N=4). Thus, in this case, two or more sets of parallel blocks are constructed. In the case where two sets of parallel blocks are constructed, a minimum required number of blocks, that is, five blocks, are divided into two groups one of which contains one block and the other of which contains four blocks or into two groups one of which contains two blocks and the other of which contains three blocks.

If five blocks are divided into two groups one of which contains one block and the other of which contains four blocks, that is, if two sets of parallel blocks are constructed such that one set contains one block and the other set contains four blocks, then the set of parallel blocks containing one block does not meet the requirement regarding the interleaving number $I_i$ (=1) defined by equation (3) although the set of parallel blocks containing four blocks meets the requirement regarding the interleaving number $I_i$ (=4) defined by equation (3). On the other hand, in the case where two sets of parallel blocks are constructed such that one set contains two blocks and the other set contains three blocks, the set of parallel blocks containing two block does not meet the requirement regarding the interleaving number $I_i$ (=2) defined by equation (3) although the set of parallel blocks containing three blocks meets the requirement regarding the interleaving number $I_i$ (=3) defined by equation (3).

Thus, in both manners in terms of construction of two sets of parallel blocks, one of two sets of parallel blocks does not meet equation (3). In such a case, sets of parallel blocks are constructed such that the number of blocks (interleaving number) contained in one set of parallel blocks which does not meet equation (3) becomes as close to the minimum number of blocks $I_{min}$ as possible. Thus, in the specific example described herein, two sets of parallel blocks are constructed such that one set contains two blocks and the other set contains three blocks.

The reason why sets of parallel blocks should be constructed such that the number of blocks contained in one set which does not meet equation (3) becomes as close to the minimum number of blocks $I_{min}$ is described in further detail below. As long as a set of parallel blocks is constructed such that the number of blocks contained in that set is equal to or greater than the minimum number of blocks $I_{min}$, the waiting time caused by the programming time $t_{prog}$ becomes zero regardless of the number of blocks. However, if the number of blocks contained in a set of parallel blocks is smaller than the minimum number of blocks $I_{min}$, the waiting time increases with the reduction in the number of blocks contained in the set of parallel blocks, as described earlier. Therefore, when the number of blocks contained in a set of parallel blocks is smaller than the minimum number of blocks $I_{min}$, the waiting time can be minimized by constructing the set of parallel blocks such that it contains as many blocks as possible.

On the other hand, in the case where N=4, $I_{min}$=2, $L_f$=6, the minimum required number of blocks $L_f$ (=6) is greater than the number of recording medium segments 1A–1D of the recording medium 1 (N=4). Thus, also in this case, two or more sets of parallel blocks are constructed. In the case where two sets of parallel blocks are constructed, a minimum required number of blocks, that is, six blocks, are divided into two groups one of which contains one block and the other of which contains five blocks, or into two groups one of which contains two blocks and the other of which contains four blocks, or otherwise into two groups both containing three blocks.

If six blocks are divided into two groups one of which contains two blocks and the other of which contains four blocks or into two groups both containing three blocks, that is, if two sets of parallel blocks are constructed such that one set contains two blocks and the other set contains four blocks or such that both sets contain three blocks, then equation (3) is satisfied. Thus, either manner in terms of construction of the two sets of parallel blocks may be employed. However, for ease of processing, it is more desirable to construct the two sets of parallel blocks such that both sets contain three blocks than to construct them such that one set contains two blocks and the other contains four blocks.

In this specific example, equation (3) is also satisfied when three sets of parallel blocks are constructed such that each set contains two blocks. However, the increase in the number of sets of parallel blocks results in an increase in complexity associated with the processing such as writing and reading of data and also an increase in complexity associated with management of blocks. Therefore, it is desirable that the number of sets of parallel blocks is as small as possible.

The manner of extracting (selecting) blocks from the recording medium 1 to construct a set of parallel blocks according to the new parallel recording method is described below. In the following description, the minimum number of blocks $I_{min}$ is assumed to be equal to 3 although not limited thereto.

If there are two files, first and second files, to be written, and if the minimum required number of blocks $L_f$ is equal to, for example, 6 for each file, then two sets of parallel blocks each containing three blocks are constructed for each of the first and second files according to equations (1) to (3). That is, two sets of parallel blocks whose interleaving number is equal to 3 are constructed. The blocks of the two sets of parallel blocks are selected from the recording medium 1 in such a manner as to not create an imbalance in terms of the size of writable areas.

First, by referring to the free area lists 6A to 6D, a free area containing blocks the number of which is closest to and greater than $L_c$ is detected from each recording medium segment 1A–1D by referring to the free area lists 6A–6D.

More specifically, for the first file, a free area consisting of blocks the number of which is closest to and greater than the number of parallel blocks, or 2, is detected from each recording medium segment 1A–1D.

Therefore, when the first file is written into the recording medium 1 which is currently in the state shown in FIG. 5A, a free area consisting of a block CB[0:0] denoted by (3) and a block CB[0:1] denoted by (6) is detected from the recording medium segment 1A and a free area consisting of a block CB[1:0] denoted by (7) and a block CB[1:1] denoted by (10) is detected from the recording medium segment 1B. Similarly, a free area consisting of a block CB[2:0] denoted by 23) and a block CB[2:1] denoted by (5) is detected from the recording medium segment 1C and a free area consisting of a block CB[3:0] denoted by (1) and a block CB[3:1] denoted by (8) is detected from the recording medium segment 1D.

From the free areas detected in the above-described manner (herein after referred to simply as detected free areas), free areas to be used to construct the sets of parallel blocks are selected as follows.

Of the detected free areas detected from the recording medium segments 1A–1D, those which have a larger size are selected in preference to the other such that the total number of selected free areas becomes equal to the interleaving number, that is 3 in this specific example. In the specific example shown in FIGS. 5A and 5B, the detected free area consisting of blocks (1), (4), (8), and (12) is first selected and then the detected free area consisting of blocks (2), (5), and (11) is selected.

Figure 5B:
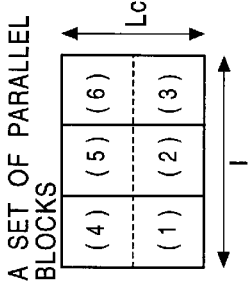

As shown in FIGS. 5A and 5B, the detected free area consisting of blocks (3) and (6) and the detected free area consisting of blocks (7) and (10) are equal in superiority in terms of the size because both detected free areas contain two blocks.

In this case, of the two detected free areas detected from the two recording medium segments, respectively, a detected free area detected from a recording medium segment having a greater number free areas than the other recording medium segment is selected. In this specific example, the free area list 6A indicates that there are two free areas in the recording medium segment 1A from which the free area consisting of blocks (3) and (6) has been detected, and the free area list 6B indicates that there is one free area in the recording medium segment 1B from which the free area consisting of blocks (7) and (10) has been detected. Thus, the recording medium segment 1A includes a greater number of free areas and, therefore, the detected free area consisting of blocks (3) and (6) detected from this recording medium segment is selected in preference to the other detected free area.

Thus, in conclusion, the following three detected free areas are selected: the detected free area consisting of blocks (1), (4), (8), and (42) of the recording medium segment 1D, the detected free area consisting of blocks (2), (5), and (11) of the recording medium segment 1C, and the detected free area consisting of blocks (3) and (6) of the recording medium segment 1A.

Using these three detected free areas selected, sets of parallel blocks are constructed as follows.

As many blocks as $L_c$, that is, two blocks in this specific example, are selected from each of the three detected free areas in the same order as that in which the free areas were selected. If the number of blocks contained in a detected free area is greater than $L_c$, blocks having smaller physical addresses are selected in preference to the other blocks.

Thus, the blocks (1) and (4) are first selected from the detected free area which was selected first and which consists of the blocks (1), (4), (8), and (12). The blocks (2) and (5) are then selected from the detected free area which was selected next and which consists of the blocks (2), (5), and (11). Finally, the blocks (3) and (6) are selected from the detected free area which was selected last and which consists of the blocks (3) and (6). These six selected blocks (1)–(6) are used to construct two sets of parallel blocks used to store the first file.

Herein, a collection of one or more sets of parallel blocks constructed for use in writing data of a file is called a superset of parallel blocks. More specifically, a superset of parallel blocks is obtained which consists of blocks (1) and (4), (2) and (5), and (3) and (6) arranged, as shown in FIG. 5B, in the same order as the order in which blocks were selected. If the interleaving numbers are $I_1=I_2= \ldots =I_{LC}=I$, then the superset of parallel blocks consists of blocks arranged in the form of a I×$L_c$ array.

In the superset of parallel blocks, for example three blocks (1) to (3) in the first row from the bottom (the row at the bottom) are employed to construct a first set of parallel blocks of the two sets of parallel blocks used for the first file and three blocks (4) to (6) in the second row from the bottom (the row at the top in the example shown in FIG. 5B) are employed to construct a second set of parallel blocks of the two sets of parallel blocks used for the first file.

For the first file, writing is first performed into the first set of parallel blocks consisting of blocks (1) to (3) according to the parallel recording method described earlier with reference to FIGS. 1 and 2, and then into the second set of parallel blocks consisting of blocks (4) to (6). After that, the file management information and block management information described earlier with reference to FIG. 2 are updated. The free area lists 6A to 6D shown in FIG. 5A are also updated as required.

Figure 6A:
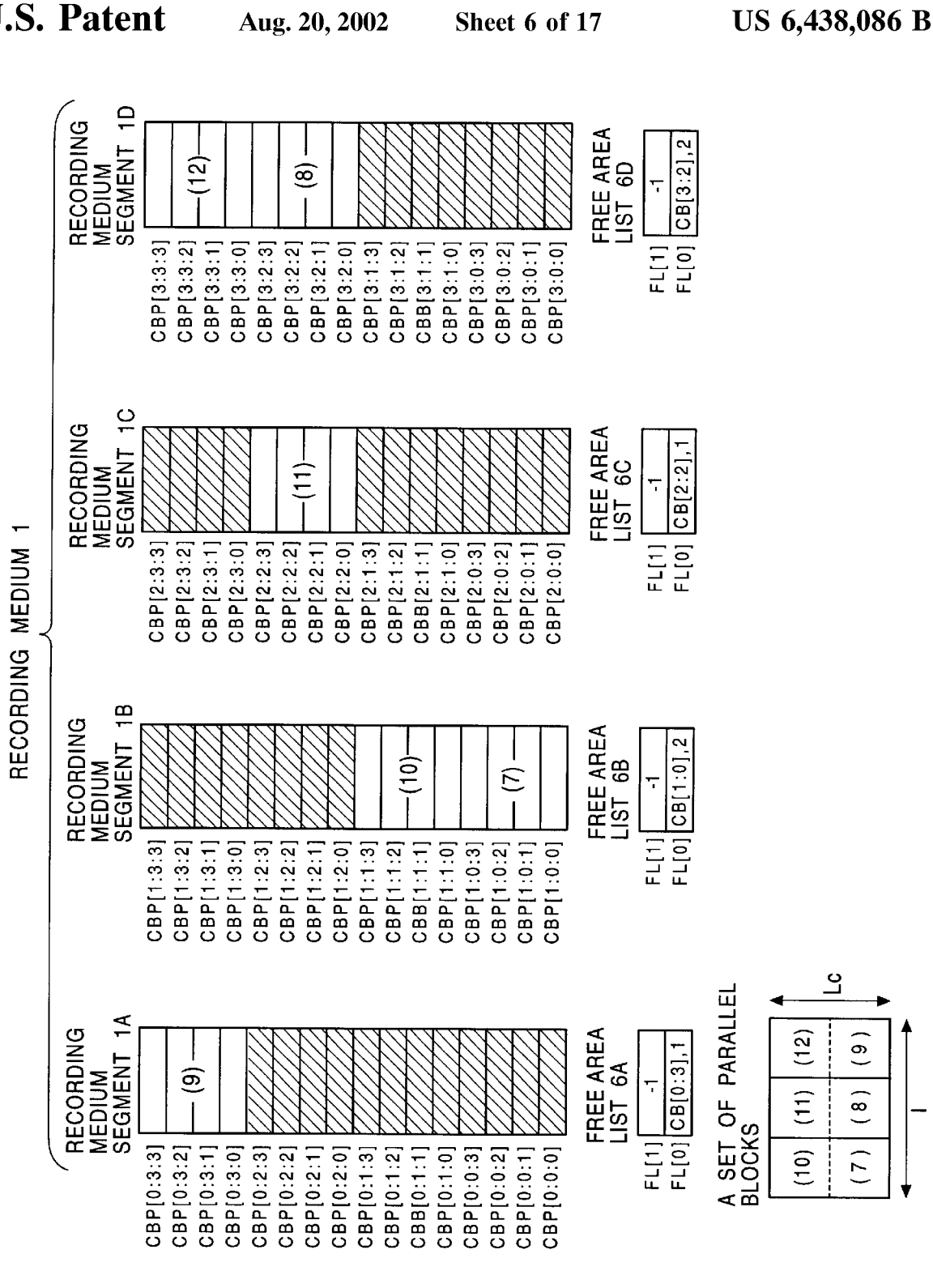
FIGS. 6A and 6B are schematic diagrams illustrating the new parallel recording method.

After completion of writing the first file, the states of the recording medium 1 and the free area lists 6A to 6D become as shown in FIG. 6A.

That is, a free area consisting of only a block CB[0:3] denoted by (9) remains in the recording medium segment 1A, a free area consisting of a block CB[1:0] denoted by (7) and a block CB[1:1] denoted by (10) remains in the recording medium segment 1B, a free area consisting of only a block CB[2:2] denoted by (11) remains in the recording medium segment 1C, and a free area consisting of a block CB[3:2] denoted by (8) and a block CB[3:3] denoted by (12) remains in the recording medium segment 1D.

Into these remaining free areas, the second file is then written. Also in this case, a free area containing blocks the number of which is closest to and greater than the number of parallel blocks $L_c$, or 2, is detected from each recording medium segment 1A–1D.

A free area consisting of two blocks is detected from the recording medium segments 1B and 1D, respectively. However, the recording medium segments 1A and 1C both include only a free area consisting of one block, and thus no free area is detected from these two recording medium segments 1A and 1C.

When a free area with an interleaving number greater than 1 is not detected from a recording medium segment, as is the case with the present example, the new recording method decrements $L_c$ by 1. In this specific example, $L_c$ becomes 1 after being decremented. Thus, a free area containing blocks the number of which is closest to and greater than 1 is detected from each recording medium segment 1A–1D.

In this specific example, a free area consisting of a block (9) is detected from the recording medium segment 1A, a free area consisting of blocks (7) and (10) is detected from the recording medium segment 1B, a free area consisting of a block (11) is detected from the recording medium segment 1C, and a free area consisting of blocks (8) and (12) is detected from the recording medium segment 1D.

From the free areas detected in the above-described manner (detected free areas), free areas to be used to construct the sets of parallel blocks are selected in a similar manner to the process for the first file.

That is, of the detected free areas detected from the recording medium segments 1A–1D, those which have a larger size are selected in preference to the other such that the total number of selected free areas becomes equal to the interleaving number I, that is 3 in this specific example. In the specific example shown in FIGS. 6A and 6B, the detected free area consisting of blocks (8) and (12) and the detected free area consisting of blocks (7) and (10) are first selected in preference to the other free areas. The detected free area consisting of blocks (8) and (12) and the detected free area consisting of blocks (7) and (10) are equal in superiority in terms of the size because both detected free areas contain two blocks. In such a case, for example, a detected free area detected from a recording medium segment whose location is closer to the leftmost position in FIGS. 6A and 6B (FIGS. 5A and 5B) is selected in preference to the other. Thus, the free area consisting of blocks (7) and (10) is first selected, and then the free area consisting of blocks (8) and (11) is selected.

Figure 6B:
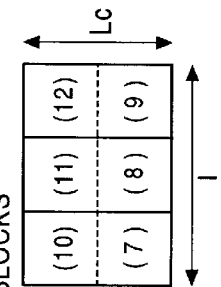

In FIGS. 6A and 6B, the detected free area consisting of the block (9) and the detected free area consisting of the block (11) are equal in superiority in terms of the size because both detected free areas contain one block. Furthermore, the recording medium segment 1A from which the detected free area consisting of the block (9) is detected and the recording medium segment 1C from which the detected free area consisting of the block (11) is detected both include only one free area, and thus there is no difference in superiority also in terms of the number of free areas contained in the recording medium segments. In this case, either the detected free area consisting of the block (9) or the detected free area consisting of the block (11) may be selected in preference to the other. Herein, let us determine priority such that a detected free area detected from a recording medium segment whose location is closer to the leftmost position in FIG. 6 (FIG. 5) is selected in preference to the other, as in the previous case described above. Thus, in this specific example, the free area consisting of the block (9) is selected in preference to the other.

Thus, in conclusion, the following three detected free areas are selected: the detected free area consisting of blocks (7) and (10) of the recording medium segment 1B, the detected free area consisting of blocks (8) and (12) of the recording medium segment 1D, and the detected free area consisting of the block (9) of the recording medium segment 1A.

Using these three detected free areas selected, sets of parallel blocks are constructed as follows.

As many blocks as $L_c$, that is, one block in this specific example is selected from each of the three detected free areas in the same order as that in which the free areas were selected. If the number of blocks contained in a detected free area is greater than $L_c$, a block having a smaller physical address is selected as described earlier.

Thus, the block (7) is first selected from the detected free area which was selected first and which consists of the blocks (7) and (10). The block (8) is then selected from the detected free area which was selected next and which consists of the blocks (8) and (12). Finally, the block (9) is selected from the detected free area which was select last and which consists of the block (9). These three selected blocks (7)–(9) are used to construct a first set of the two sets of parallel blocks used to store the second file.

The value of $L_c$ obtained by decrementing the original value of $L_c$ (2 in this specific example) is employed as the new value of $L_c$ (1 in this specific example), and the above-described process is repeated for the new value of $L_c$.

At this stage, no free area remains in the recording medium segment 1A. On the other hand, a free area consisting of the block (10) remains in the recording medium segment 1B, a free area consisting of the block (11) remains in the recording medium segment 1C, and a free area consisting of the block (12) remains in the recording medium segment 1D.

From these remaining free areas, blocks are further selected to construct a second parallel blocks used to write the second file.

Also in this case, a free area containing blocks the number of which is closest to and greater than $L_c$ is detected from each recording medium segment 1A–1D. In this specific example $L_c$=1 and thus a free area containing blocks the number of which is closest to and greater than 1 is detected from each recording medium segment 1A–1D.

No free area is detected from the recording medium segment 1A. On the other hand, the free area consisting of the block (10) is detected from the recording medium segment 1B, the free area consisting of the block (11) is detected from the recording medium segment 1C, and the free area consisting of the block (12) is detected from the recording medium segment 1D.

From the free areas detected in the above-described manner (detected free areas), free areas to be used to construct the sets of parallel blocks are selected in a similar manner to the process described above.

That is, from the detected free areas detected from the recording medium segments 1A–1D, as many free areas as the interleaving number I, that is, three in this specific case, are selected by selecting those which have a larger size in preference to the other. More specifically, the detected free area consisting of the block (10), the detected free area consisting of the block (11), and the detected free area consisting of the block (12) are selected. In this selecting process, the above three detected free areas are equal in superiority in terms of the size, and thus a detected free area detected from a recording medium segment whose location is closer to the leftmost position is selected in preference to the other, as described earlier. More specifically, detected free areas are selected in the order: the detected free area consisting of the block (10); the detected free area consisting of the block (11); and the detected free area consisting of the block (12).

At this stage, as many detected free areas as the interleaving number I, that is three in this case, have already been selected, and thus a set of parallel blocks is constructed using blocks of these three detected free areas.

More specifically, as many blocks as $L_c$, that is, one in this case, is selected from each of the three detected free areas in the same order as that in which the detected free areas were selected.

Thus, the block (10) is first selected from the detected free area which was selected first and which consists of the block (10). The block (11) is then selected from the detected free area which was selected next and which consists of the block (11). Finally, the block (12) is selected from the detected free area which was select last and which consists of the block (12). These three selected blocks (10)–(12) are used to construct the second set of the two sets of parallel blocks used to store the second file.

Thus, for use in writing the second file, a superset of parallel blocks consisting of the first parallel blocks containing the blocks (7)–(9) and the second set of parallel blocks containing the blocks (10)–(12) is constructed as shown in FIG. 6B.

For the second file, writing is first performed into the first set of parallel blocks consisting of blocks (1)–(3) according to the parallel recording method described earlier with reference to FIGS. 1 and 2, and then into the second set of parallel blocks consisting of blocks (10)–(12). After that, the file management information and block management information described earlier with reference to FIG. 2 are updated. The free area lists 6A to 6D shown in FIG. 5B are also updated as required.

By constructing a parallel lock set using blocks selected from free areas consisting of blocks the number of which is closest to and greater than the number of parallel block sets (the number of parallel block sets constituting the superset of parallel blocks), it becomes possible to minimize fragmentation of writable blocks of the respective recording medium segments 1A–1D thereby making it possible to use the recording areas of the recording medium in a highly efficient fashion.

In this technique, blocks constituting a first set of parallel blocks and blocks constituting a second set of parallel blocks are allocated to physically successive areas of a recording medium segment. More specifically, in the specific example shown in FIG. 5, when the first file is written, the block (3) of the recording medium segment 1A is selected as a member of the first set of parallel blocks and the block (6) directly adjacent to the block (3) is selected as a member of the second set of parallel blocks. Similarly, the block (2) of the recording medium segment 1C is selected as a member of the first set of parallel blocks and the block (5) directly adjacent to the block (2) is selected as a member of the second set of parallel blocks, and the block (1) of the recording medium segment 1D is selected as a member of the first set of parallel blocks and the block (4) directly adjacent to the block (1) is selected as a member of the second set of parallel blocks. This makes it easy to manage and control the recording medium 1.

In the case where the recording medium segments 1A–1D are formed of, for example, flash memories, when data of a page is read from a flash memory after having read the data of the preceding page, it is possible to read the data of that page without having to specify the address of the page. Therefore, in a particular recording medium segment, if blocks, which are members of sets of parallel blocks in a superset of parallel blocks used to record a file, are allocated in a physically continuous area, then, after reading a first page by specifying its address, it is possible to read pages following the first page without having to specify their address.

Furthermore, in this technique, when free areas to be used to construct a set of parallel block are selected from detected free areas, detected free areas with a greater size are selected in preference to the other. When there are a plurality of detected free areas having the same size, the number of free areas contained in the recording medium segments from which the plurality of detected free areas having the same size were detected are compared with each other, and a detected free area detected from a recording medium segment having a greater number of free areas than the other recording medium segments is selected in preference to the other detected free areas. This prevents the writable areas from becoming unbalanced in size among the recording medium segments 1A–1D. Thus, it becomes possible to reduce the probability that the number of recording medium segments having a writable area becomes smaller than the minimum number of blocks $I_{min}$ due to the unbalance in the size of the writable areas.

As a result, the increase in the writing speed obtained by the parallel recording method can be maximized.

In the embodiment described above with reference to FIGS. 5A and 5B, in the process of writing the first file, of the two detected free areas, that is, the detected free area consisting of the blocks (3) and (6) and the detected free area consisting of the blocks (7) and (10), the free detected area detected from the recording medium segment 1A having a greater number of free areas is given a higher selection priority. That is, the detected free area consisting of the blocks (3) and (6) is given a higher selection priority. If, instead, the other detected free area, that is, the detected free area consisting of the blocks (7) and (10) detected from the recording medium segment 1B having a smaller number of free areas is selected, problems occur when the second file is written, as described below.

In this case, in order to write the first file, a superset of parallel blocks consisting of a first set of parallel blocks containing blocks (1), (2), and (7) a second set of parallel blocks containing blocks (4), (5), and (10) is constructed, and writing is first performed into the first set of parallel blocks containing blocks (1), (2), and (7) according to the parallel recording method. After completion of the writing into the first set of parallel blocks, writing is performed into the second set of parallel blocks containing blocks (4), (5), and (10).

As a result, at the time when the writing of the first file is completed, a free area consisting of blocks (3) and (6) and a free area consisting of the block (9) remain in the recording medium segment 1A, a free area consisting of the block (11) remains in the recording medium segment 1C, and a free area consisting of blocks (8) and (12) remains in the recording medium segment 1D. However, no free area remains in the recording medium segment 1B.

As a result, the recording medium segment 1B becomes incapable of being used in the following writing process according to the parallel recording method. Therefore, the following writing process is performed using three recording medium segments 1A, 1C, and 1D.

In this case, a first set of parallel blocks to be used to write the second file is constructed of the block (3) selected from the recording medium segment 1A, the block (11) selected from the recording medium segment 1C, and the block (8) selected from the recording medium segment 1D. At this stage, no free area remains in the recording medium segment 1C. As a result, in the following process, a set of parallel blocks is constructed using the two recording medium segments 1A and 1D.

In this case, in equation (3), N becomes smaller than $I_{min}$ and thus it becomes impossible to obtain an interleaving number I which satisfies equation (3). In this case, in equation (3), N representing the number of recording medium segments having a free area becomes 2, and thus the interleaving number I becomes 2 at most.

Herein, if the interleaving number I is set to the maximum possible value or 2, then, for use in writing the second file, the block (6) of the recording medium 1A and the block (12) of the recording medium segment 1D are selected and a set of parallel blocks consisting of these two blocks is constructed as the second set of parallel blocks. At this stage, no free area remains in the recording medium segment 1D. As a result, in the following process, a set of parallel blocks is constructed using only one recording medium segment 1A.

Thus, the maximum possible value of the interleaving number I becomes equal to the number of recording medium segments having a free area, that is, 1 in this case. Therefore, for use in writing the second file, the block (9) of the recording medium segment 1A is selected and a parallel block set consisting of this one block is constructed as a third parallel block set.

Eventually, in the process of writing the second file, the first parallel block set consisting of three blocks, the second parallel block set consisting of two block, and the third parallel block set consisting of one block are constructed. However, in the process of writing data into the second and third parallel block sets according to the parallel recording method, a waiting time caused by the programming time $t_{prog}$ is required because the number of blocks contained in each of the second and third parallel block sets is smaller than the minimum number of blocks $I_{min}$ or 3. As a result, an effective increase in the writing speed is not achieved.

In contrast, if, in the process of writing the second file, selection of a detected free area is performed such that the number of free areas contained in the recording medium segment from which the detected free area consisting of the blocks (3) and (6) is detected and the number of free areas contained in the recording medium segment from which the detected free area consisting of the blocks (7) and (10) are compared with each other, and the detected free area detected from the recording medium segment having a greater number of free areas, that is, the detected free area consisting of the blocks (3) and (6) detected from the recording medium segment 1A in this specific example is selected in preference to the other, then no waiting time is required.

Figure 7:
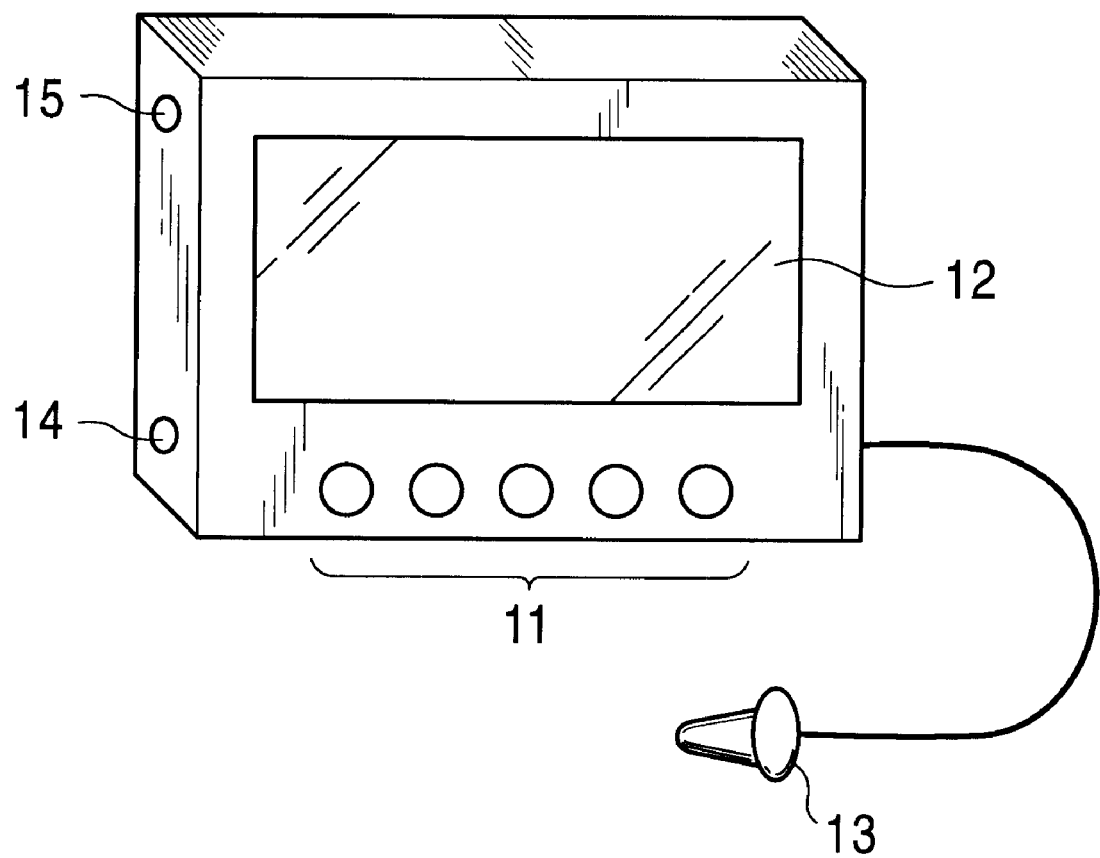
FIG. 7 is a perspective view illustrating the external appearance of a first example of a user terminal.

FIG. 7 illustrates a first embodiment of a user terminal (recording/reproducing apparatus) having the capability of writing data according to the new parallel recording method of the invention wherein the external appearance of the apparatus is shown.

The user terminal of this embodiment includes a control unit 11 including buttons used to input various commands and a display unit such as a liquid crystal panel 12 for displaying various kinds of information such as a character or an image, wherein the control unit 11 and the display unit 12 are disposed on the front surface of the user terminal. The user terminal also includes a recording medium 1 (not shown in FIG. 7) disposed in the inside thereof. If a user operates the control unit 11, data is read from the recording medium 1. In the case where the data represents a character or an image, the character of the image is displayed on the display unit 12.

The user terminal also includes an earphone 13. When the data read from the recording medium 1 is audio data, a sound represented by the audio data is output via the earphone.

The user terminal may also include a loudspeaker instead of or together with the earphone 13 so that a sound may be output via the loudspeaker. In the case where the data read from the recording medium 1 is a computer program, the computer program is executed on the user terminal and various processes are performed.

The user terminal includes two terminals 14 and 15 disposed on the left side face. The terminal 14 is used to input various data supplied from an information supplying apparatus which will be described later with reference to FIG. 9 or 10. The data input via this terminal 14 is recorded on the recording medium 1 disposed in the user terminal. The terminal 15 is used to output data reproduced from the recording medium 1. That is, the data recorded on the recording medium 1 can be output via the terminal 15 so as to supply it to an external display or loudspeaker. The data recorded on the recording medium 1 may also be output via the terminal 14.

Figure 8:
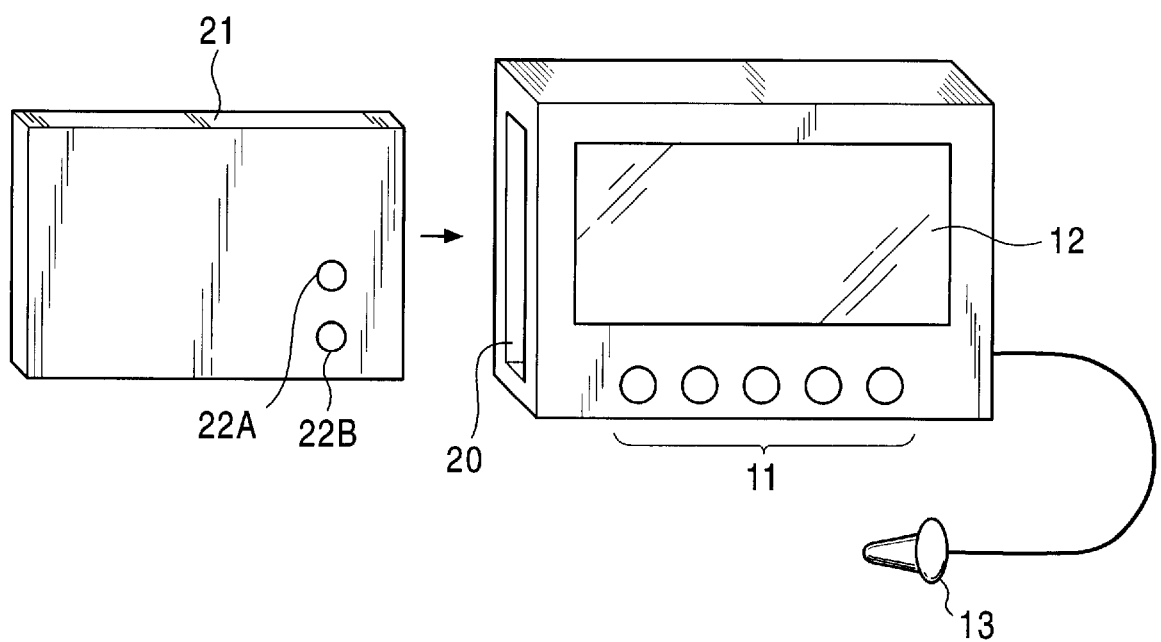
FIG. 8 is a perspective view illustrating the external appearance of a second example of a user terminal.

FIG. 8 illustrates the external appearance of a second embodiment of a user terminal capable of writing data according to the new parallel recording method of the invention. In FIG. 8, similar parts to those in FIG. 7 are denoted by similar reference numerals.

In this second embodiment, instead of the terminals 14 and 15, a slot 20 is formed in the left side face of the user terminal so that a memory card 21 may be inserted in the slot 20.

The memory card 21 includes a recording medium 1 disposed in the inside thereof. If the memory card 21 is inserted in the slot 20, data recorded on the recording medium 1 can be used in a similar manner to the first embodiment described above with reference to FIG. 7.

The memory card 21 includes a terminal 22A formed on the front surface thereof. When the memory card 21 is inserted in the slot 20, the terminal 22A comes into contact with a terminal (not shown) disposed inside the slot 20 so that the memory card 21 and the user terminal are electrically connected to each other thereby making it possible to use the data recorded on the recording medium 1 disposed inside the memory card 21. That is, the data recorded on the recording medium 1 disposed inside the memory card 21 is read (reproduced) via the terminal 22A.

The memory card also includes a terminal 22B formed on the front surface thereof. When the memory card 21 is inserted in a slot 33 or the like of the information supplying apparatus shown in FIG. 9, which will be described later, the terminal 22B comes into contact with a terminal (not shown)

disposed inside the slog 33 so that the memory card 21 and the information supplying apparatus are electrically connected to each other, thereby making it possible for the information supplying apparatus to record data on the recording medium 1 disposed inside the memory card 21. That is, data is supplied from the information supplying apparatus to the memory card 21 via the terminal 22B and recorded on the recording medium 1 disposed inside the memory card 21.

In this embodiment shown in FIG. 8, the memory card 21 is removable from the user terminal and a user can carry only the memory card 21 to a location where an information supplying apparatus is disposed so as to receive data. This allows the user to carry it in a more convenient fashion than to carry the user terminal, shown in FIG. 7, which includes the recording medium 1 disposed inside the user terminal.

In the embodiment shown in FIG. 8, the memory card 21 includes two terminals, that is, the terminal 22A for outputting data recorded on the recording medium 1 and the terminal 22B for inputting data to be recorded on the recording medium 1. Alternatively, the memory card 21 may include only one terminal which can be electrically switched such that the one terminal may be used both to output data recorded on the recording medium 1 and to input data to be recorded on the recording medium 1.

Figure 9:
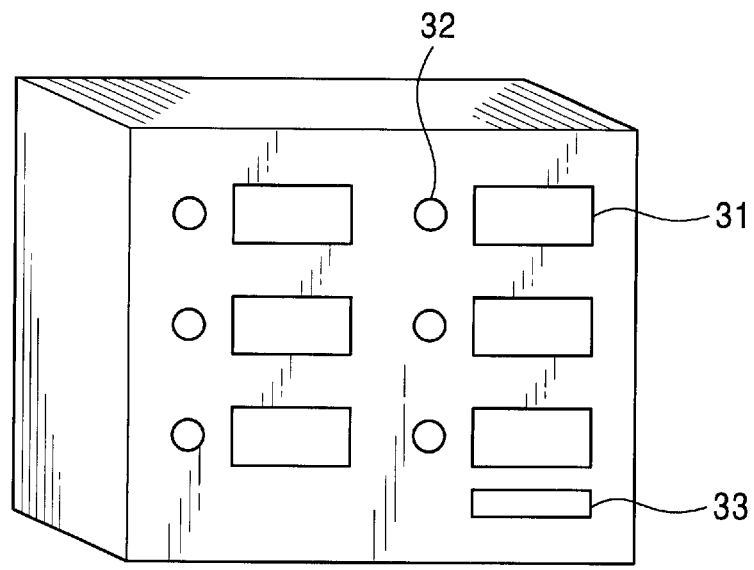
FIG. 9 is a perspective view illustrating the external appearance of a first example of an information supplying apparatus for supplying data to a user terminal.

FIG. 9 illustrates the external appearance of a first embodiment of an information supplying apparatus for supplying data to the user terminal shown in FIG. 7 or the recording medium 1 disposed in the memory card 21 shown in FIG. 8.

On the front panel of the information supplying apparatus, there are provided display units 31 for displaying the contents and price of data to be supplied to a user and operating buttons 32 used to select data displayed on the corresponding display units 31. In the specific example shown in FIG. 9, six sets of display units 31 and operating buttons 32 are provided so that six different data can be supplied.

In the front panel, there is also provided a slot 33 in which the user terminal shown in FIG. 7 or the memory card shown in FIG. 8 is inserted.

A user, who wants to receive data, inserts the user terminal shown in FIG. 7 or the memory card 21 shown in FIG. 8 into the slot 33 so that the terminal 14 of the user terminal or the terminal 22B of the memory card is electrically connected to the information supplying apparatus.

If a user selects desired data in accordance with the contents displayed on the display units 31 by pressing a corresponding operating button 32, then the data corresponding to the pressed operating button 32 is transferred to the recording medium 1 in the user terminal or the memory card 21 inserted in the slot 33 and recorded (copied) thereon.

The information supplying apparatus includes recording media on which data corresponding to the six display units 31 disposed on the front panel are recorded and also includes a copy controller for controlling the operation of copying data recorded on the recording medium (none is shown in FIG. 9). If an operating button 32 of the information supplying apparatus is pressed, Under control of the copy controller, data is read from a recording medium on which data corresponding to the pressed operating button is stored and the data is transferred to and recorded on the recording medium 1 in the user terminal or the memory card 21 inserted in the slot 33.

The information supplying apparatus may be connected via a cable or a radio communication line to a data management center which manages data to be supplied. In this case, the information supplying apparatus receives data corresponding to a pressed operating button 32 from the data management center via the communication line and supplies the received data to the user. In this case, the information supplying apparatus is not required to have a recording medium for storing data to be supplied to the user. Alternatively, the contents recorded on the recording medium in the information supplying apparatus may be updated by data received via the communication line. This makes it unnecessary to manually exchange the recording medium in the information supplying apparatus to update the data. In this case, once data has been recorded on the recording medium, it is possible to supply data to the user from the recording medium without having to again receive the data from the data management center. This allows newest data to be supplied to the user without causing a significant increase in communication cost.

Figure 10:
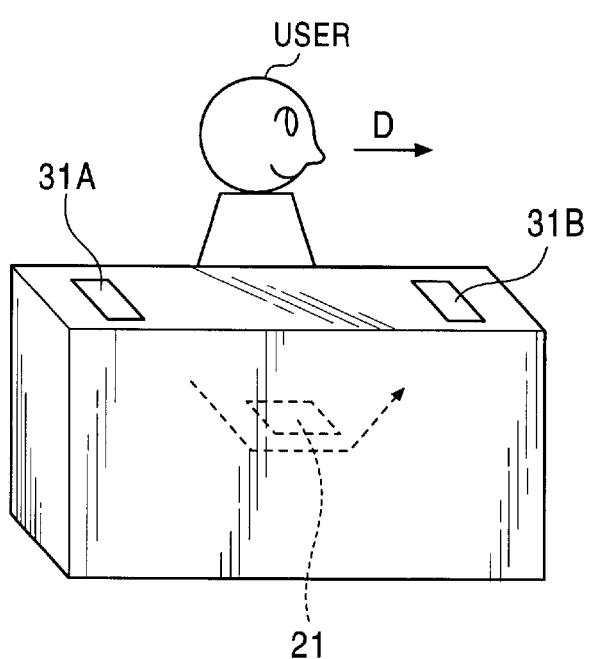
FIG. 10 is a perspective view illustrating the external appearance of a second example of an information supplying apparatus for supplying data to a user terminal.

FIG. 10 illustrates the external appearance of a second embodiment of an information supplying apparatus.

In this embodiment, in the upper surface of the information supplying apparatus there are formed an inlet slot 31A for receiving a memory card 21 and an outlet slot 31B for outputting the memory card received via the inlet slot 31A.

A user who wants to receive data inserts the memory card 21 into the inlet slot 31A and then walks in a direction denoted by an arrow D in FIG. 10. The information supplying apparatus includes a transporting device (not shown) for transporting the memory card 21 from the inlet slot 31A to the outlet slot 31B. When the memory card 21 is at rest at a particular location in the transportation path, or when the memory card 21 is being transported, data is recorded into the memory card 21. The transportation time required for the transporting device to transport the memory card 21 from the inlet slot 31A to the outlet slot 31B is designed to be substantially equal to the time required for the user to walk from the inlet slot 31A to the outlet slot 31B so that when the user reaches the output slot 31B after inserting his/her memory card 21 via waking in a direction denoted by an arrow D, the memory card 21 on which data has been recorded is ejected via the output slot 31B.

By constructing the information supplying apparatus in the above-described manner, it becomes possible to supply data to users more quickly.

By modifying the transporting device disposed in the information supplying apparatus shown in FIG. 10, it becomes possible to supply data to a user terminal including a recording medium 1 of the type shown in FIG. 7.

Figure 11:
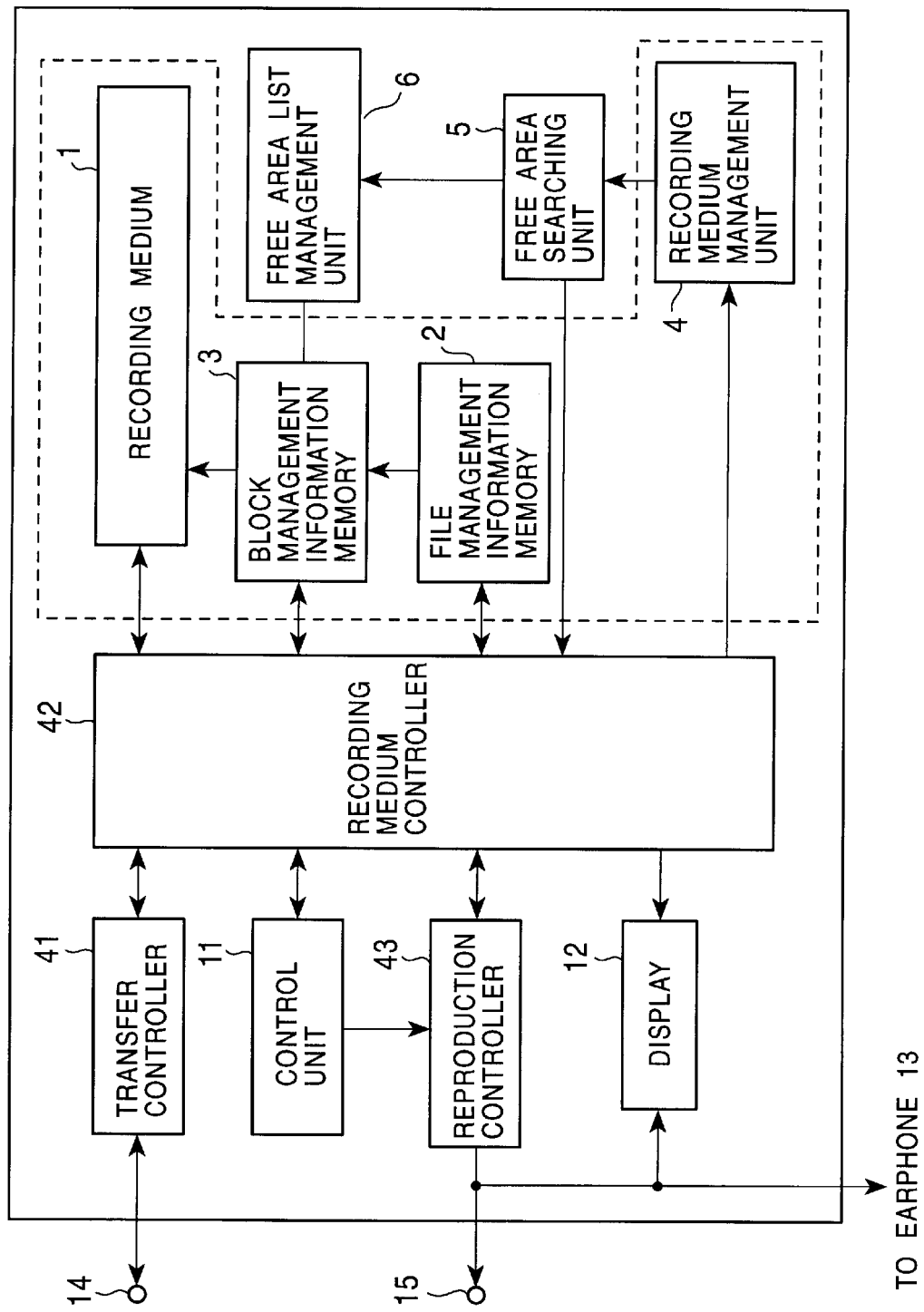
FIG. 11 is a block diagram illustrating an example of electrical configuration of the user terminal shown in FIG. 7.

FIG. 11 is a block diagram illustrating an example of the electrical configuration of the user terminal shown in FIG. 7.

The recording medium 1 includes, as described above, a plurality of recording medium segments, that is, four recording medium segments 1A–1D in this specific example, for storing data. Although, there is no particular limitation in terms of the type of the recording medium segments 1A–1D, it is desirable to employ semiconductor memories having advantages of high recording (storing) speed, capability of random access, and ease of carrying. Herein, by way of example, the recording medium segments 1A–1D are each formed of a nonvolatile memory such as a NAND type flash memory which is one type of a semiconductor memory and which does not need backup with a battery. More specifically, the recording medium segments 1A–1D may be realized using, for example, EEPROMs (Electrically Erasable and Programmable ReadOnly Memory) disclosed for example in "32 Mbit NAND flash memory" (Electronic Material, No. 6, 1995, pp.32–37).

Herein, it is required that the number of recording medium segments constituting the recording medium 1 be equal to or greater than ceil($t_{prog}/t_{input}$)+1. Some NAND type flash memories (EEPROMS) need a programming time $t_{prog}$ as great as for example 10 times the data inputting time $t_{input}$. When such a flash memory is employed to form each medium segment, it is required that the recording medium 1 include 11 or more recording medium segments.

The file management information memory 2 and the block management information memory 3 store the file management information and the block management information, respectively, described earlier with reference to FIG. 2. The recording medium management unit 4 stores characteristic information on the recording medium 1 (characteristic information on the recording medium segments 1A–1D constituting the recording medium 1), that is, information representing the data inputting time $t_{input}$ and the programming time $t_{prog}$. Alternatively, instead of information representing the data inputting time $t_{input}$ and the programming time $t_{prog}$, the recording medium management unit 4 may store information representing the minimum number of blocks $I_{min}$ calculated from equation (1).

In the case where the user terminal is constructed in such a manner that the memory card 21 is removable as shown in FIG. 8, the memory card 21 is formed to include, for example, the recording medium 1, the file management information memory 2, the block management information memory 3, and the recording medium management unit 4.

A free area searching unit 6 searches a free area list management unit 6 to detect a free area of the recording medium 1 and supplies the result to a recording medium controller 42. The free area list management unit 6 produces free area lists by referring to the block management information stored in the block management information memory 3 and manages the free area lists produced. More specifically, the free area list management unit 6 produces and manages the free area lists 6A–6D described earlier with reference to FIG. 5 associated with the recording medium segments 1A–1D, respectively, constituting the recording medium 1. The free area searching unit 5 searches for free areas of the respective recording medium segments 1A–1D by referring to the free area lists 6A–6D.

A control unit 11 is operated by a user. The control unit 11 generates a signal corresponding to an operation performed by the user and transmits it to a transfer controller 41, the recording medium controller 42, and a reproduction controller. A display unit 12 displays data (if possible to display) output from the reproduction controller 43.

The transfer controller 41 controls the operation of transferring data received via the terminal 14 to the recording medium controller 42 and data generated by the recording medium controller 42 to the terminal 14.

The recording medium controller 42 records (writes) data supplied from the transfer controller 41 on the recording medium 1. The recording medium controller 42 also reproduces (reads) data from the recording medium 1 and supplies it to the transfer controller 41 or the reproduction controller 43.

According to the new recording method, the recording medium controller 42 controls the operation of recording data on the recording medium 1 on the basis of information stored in the file management information memory 2, the block management information memory 3, and the recording medium management unit 4, and/or on the basis of information supplied from the free area searching unit 5. The recording medium controller 42 also controls the operation of reproducing (reading) data from the recording medium 1 in accordance with information stored in the file management information memory 2 and the block management information memory 3.

Furthermore, the recording medium controller 42 also controls the operation of updating the file management information and the block management information stored in the file management information memory 2 and the block management information memory 3, respectively, and also the operation of deleting data on the recording medium 1.

The reproduction controller 43 controls the operation of reproducing data received from the recording medium controller 42. More specifically, if data received from the recording medium controller 42 is encoded data, then the reproduction controller 43 decodes that data. If the data received from the recording medium controller 42 is displayable data the reproduction controller 43 transfers it to the display unit 12. If the data is audio data, then it is transferred to the earphone 13. If an executable computer program is obtained as a result of decoding, then the reproduction controller 43 executes the computer program thereby performing a particular process.

Video data or audio data may be encoded according to, for example, the MPEG (Moving Picture Experts Group) standard. The decoded data output from the reproduction controller 43 may be output to the outside via the terminal 15.

The respective blocks of the user terminal shown in FIG. 11 may be realized using hardware or a physical mechanism or may be realized by executing a computer program using a CPU (Central Processing Unit) or the like.

Figure 12:
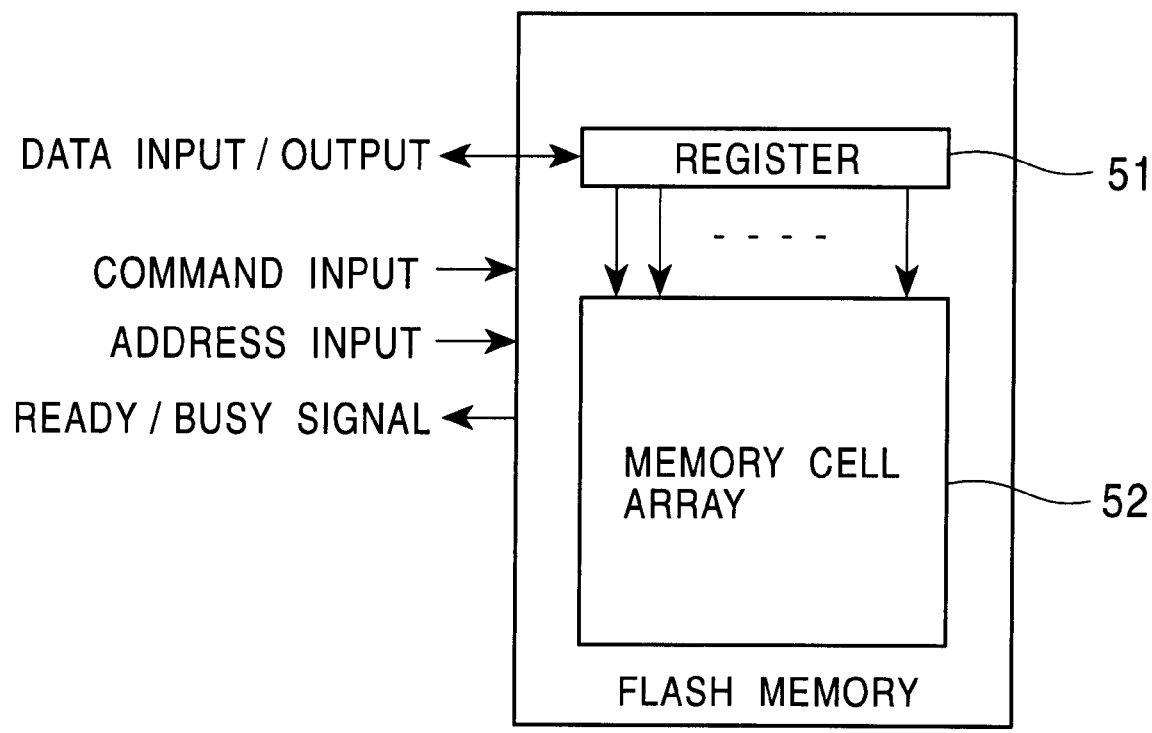
FIG. 12 is a block diagram illustrating an example of the configuration of a flash memory.

FIG. 12 illustrates an example of the construction of a NAND flash memory used to form each recording medium segment 1A–1D of the recording medium 1 shown in FIG. 11.

Main components of the flash memory are a register 51 and a memory cell array 52 in which data, a command, and an address can be stored. The flash memory is capable of outputting data recorded therein and also a ready/busy signal representing the internal state.

When data is recorded into the flash memory having the above-described structure, the data to be recorded is input page by page (herein one page consists of 512 bytes) together with a command (input command) indicating that the data should be input and an address specifying the location where the data should be recorded. In response to the input command, the data to be recorded is first input to the register 51 and temporarily stored therein. After that, a command (write command) commanding the flash memory to record the data is given to the flash memory. In response to the write command, the data stored in the register 51 is transferred to the memory cell array 52 and stored (held) at the location specified by the address supplied together with the input command.

When data is read (reproduced) from the flash memory, data to be reproduced together with a command (read command) commanding reproduction and an address indicating the location where the data to be reproduced is stored is input to the flash memory. In response to the read command, data at the location specified by the address supplied together with the read command is read from the memory cell array. The data is supplied to the register 51 and temporarily stored therein. The data stored in the register 51 is then output from the flash memory.

The ready/busy signal is in either a high or low level depending on the internal state of the flash memory. More specifically, when the flash memory is in a state in which it can accept a command, the ready/busy signal is, for example, in the low level (herein after the ready/busy signal in the low level will be referred to the ready signal). When the flash memory is in a state in which it cannot accept a command, the ready/busy signal is in the high level (hereinafter the ready/busy signal in the high level will be referred to as the busy signal).

Although not shown in FIG. 12, a chip select signal is also applied together with address data to the flash memory (the chip select signal may be regarded as being included in the address data).

The operation of the user terminal shown in FIG. 11 is described below.

When data is recorded on the recording medium 1, a signal indicating that data should be recorded (hereinafter such a signal will be referred to as a record request signal) is supplied from the information supplying apparatus shown in FIG. 9 or 10 to the recording medium controller 42 via the terminal 14 and the transfer controller 41. Upon receipt of the record request signal, the recording medium controller 42 searches for free areas via the free area searching unit 5. Furthermore, the recording medium controller 42 determines the minimum number of blocks $I_{min}$ from the data inputting time $t_{input}$ and $t_{prog}$ associated with the recording medium segments 1A–1D constituting the recording medium 1 wherein $t_{input}$ and $t_{prog}$ are stored in the recording medium management unit 4. The recording medium controller 42 then constructs a set of parallel blocks in accordance with the minimum number of blocks $I_{min}$ and depending on the available free areas in the manner described earlier.

In the above process, the free area searching unit 5 searches for free areas by referring to the free area lists 6A–6D stored in the free area list management unit 6. The free area list management unit 6 may produce the free area lists 6A–6D when the free area searching unit 5 generates a request to refer to the free area lists, or when the power of the user terminal is turned on.

In the example described earlier with reference to FIGS. 5A and 5B and 6A and 6B, free area lists 6A–6D are separately produced for the recording medium segments 1A–1D. Alternatively, free area information associated with all the recording medium segments 1A–1D may be stored in one free area list. In this case, identification information indicating the recording medium segments 1A–1D is also stored in entries of the free area list.

If the transfer controller 41 receives a record request signal via the terminal 14, the transfer controller 41 transfers the received record request signal to the recording medium controller 42. After that, the transfer controller 41 receives data to be recorded from the information supplying apparatus shown in FIG. 9 or 10 via the terminal 14 in accordance with a low level transfer protocol and transfers the received data to the recording medium controller 42. As for the low level transfer protocol, a protocol including a physical layer according to, for example, a protocol according to the ANSI (American National Standard Institute) standard X3.131-1986 which is also known as the SCSI (Small Computer System Interface) standard, the IEEE (Institute of Electrical and Electronics Engineers) standard 1394, or the PC card standard issued by the PCMCIA (Personal Computer Memory Card International Association) may be employed. Although a low level transfer protocol according to a special standard may also be employed, it is more desirable to a low level transfer which is widely used so that the user terminal may have high extensibility.

The recording medium controller 42 constructs a set of parallel blocks and transfers the data received from the transfer controller 41 to the recording medium 1 according to a high level transfer protocol defined in the new recording method thereby recording the data on the recording medium 1.

More specifically, the recording medium controller 42 sends a chip select signal to a particular one, into which data is to be recorded, of the recording medium segments 1A–1D formed of flash memories constructed as shown in FIG. 12. The recording medium controller 42 also sends to the one of the recording medium segments 1A–1D one page of data to be recorded together with an input command and address data indicating the location where the data is to be recorded. When the data inputting time $t_{input}$ has elapsed, in response to the input command, one page of data is input and stored in the register 51 of the particular one, to which the chip select signal was applied, of the recording medium segments 1A–1D (hereinafter, such a particular one of the recording medium segments will be referred to as a selected recording medium segment). After that, the recording medium controller 42 sends a write command to the selected recording medium segment. In response to the write command, the data stored in the register 51 of the selected recording medium segment is transferred to the memory cell array 52 and stored therein at the specified address in the programming time $t_{prog}$. The selected recording medium segment outputs a busy signal during the whole period from reception of the write command to completion of recording one page of data from the register 51 into the memory cell 52.

The process described above is performed on recording medium segments including a block contained in a parallel block set by selecting recording medium segments one by one. Because the recording of data is performed according to the new parallel recording method, inputting of data from the recording medium controller 42 to the recording medium 1 (and also inputting of data from the transfer controller 41 to the recording medium controller 42) is performed basically without waiting for expiration of the programming time $t_{prog}$.

If the writing of data of one file is completed, the recording medium controller 42 updates the file management information and the block management information stored in the file management information memory 2 and the block management information memory 3, respectively, in accordance with the status of the recording medium 1.

The overall recording capability (the rate at which data is recorded) of the user terminal depends on lower one of the capability of the transfer controller 41 to transfer data to the recording medium controller 42 and the capability of the recording medium controller 42 to record data on the recording medium 1. Therefore, it is desirable that the recording medium controller 42 have a capability of recording data on the recording medium 1 without causing a reduction in the data transfer capability of the transfer controller 41. The new recording method is very useful in particular when applied to the recording medium controller 42 which needs such a capability.

When data is written in a certain flash memory serving as a recording medium segment, if another piece of data remains at an address where the data is to be written, the recording medium segment 42 deletes the unnecessary data and then performs writing.

To read (reproduce) data (file) recorded on the recording medium 1, the user issues a read command by operating the control unit 11. The read command is sent to the recording medium controller 42. Upon receipt of the read command from the control unit 11, the recording medium controller 42 examines the file management information stored in the file management information memory 2 and controls the display unit 12 via the reproduction controller 43 so that file names of files stored on the recording medium 1 are displayed on the display unit 12. The user decides which file should be read from the recording medium 1 by referring to the file names displayed on the display unit 12 and designates a desired file by operating the control unit 11. The signal indicating the designated file name is sent to the recording medium controller 42. Upon receiving, from the control unit 11, the signal indicating the file name of the file to be read, the recording medium controller 42 detects the address at which the file is stored and the total size of the file by examining the file management information and the block management information associated with that file. The recording medium controller 42 reads the data of the file designated via the control unit 11 from the recording medium 1 according to the high level protocol (protocol associated with reading of data recorded in accordance with the parallel recording method).

More specifically, the recording medium controller 42 supplies a chip select signal to one of flash memory chips (selected recording medium segment) from which the data is to be read wherein the respective flash memory chips serve as the recording medium segments 1A–1D and are configures as shown in FIG. 12. Furthermore, the recording medium controller 42 supplies, to the selected recording medium segment, a read command and address data indicating the address at which the data to be read is stored. In the selected recording medium segment, after a predetermined time (required to transfer the data from the memory cell array 52 of the flash memory to the register 51) has elapsed, one page of data is read from the specified address (address of the memory cell array 52) and stored in the register 51. The data stored in the register 51 is then transferred to the recording medium controller 42 and thus reading of one page of data is completed. The selected recording medium segment outputs a busy signal during the whole period of time from the reception of the address data to the completion of transferring one page of data from the memory cell array to the register 51.

The process described above is performed on recording medium segments including a block in which the specified file is recorded by selecting recording medium segments one by one.

The data read by the recording medium controller 42 from the recording medium 1 is supplied to the transfer controller 41 or the reproduction controller 43. Whether the data read from the recording medium 1 should be supplied to the transfer controller 41 or the reproduction controller 43 can be specified by operating the control unit 121.

In the case where the data read from the recording medium 1 is supplied to the transfer controller 41, the transfer controller 41 output the received data to the outside via the terminal 14 according to the low level transfer protocol.

On the other hand, in the case where the data read from the recording medium 1 is supplied to the reproduction controller 43, the reproduction controller 43 supplies the received data to the display unit 12 or the earphone 13 to display or output the data, or the reproduction controller 43 outputs the received data to the outside via the terminal 15. If the data is a computer program, then the reproduction controller 43 executes the computer program.

Referring to a flow chart shown in FIG. 13, the data recording process performed by the recording medium controller 42 shown in FIG. 11 is described below.

To start recording data, the transfer controller 41 sends a record request signal to the recording medium controller 42, as described earlier. In step S1, the recording medium controller 42 recognizes that a file which will be transferred from the transfer controller 41 should be recorded on the recording medium 1.

In step S2, the recording medium controller 42 interprets information associated with the file to be recorded so as to detect, for example, the file name and the data size of the file. The information associated with the file to be recorded is supplied from the information supplying apparatus shown in FIG. 9 or 10 together with for example the record request signal.

In the next step S3, the recording medium controller 42 calculates the minimum number of blocks $I_{min}$ and the minimum required number of blocks $L_f$ required to record the file to be recorded.

More specifically, the recording medium controller 42 determines the minimum required number of blocks $L_f$ using the data size $C_f$ of the file determined in step S2 and the block size $C_b$ according to equation $L_f = \text{ceil}(C_f/C_b)$. Furthermore, the recording medium controller 42 reads, from the recording medium management unit 4, characteristic information representing the data inputting time $t_{input}$ and the programming time $t_{prog}$ of the flash memories serving as the recording medium segments 1A–1D of the recording medium 1 and calculates the minimum number of blocks $I_{min}$ according to equation (1).

The process goes to step S4 and the recording medium controller 42 acquires the free area lists 6A–6D via the free area searching unit 5, By referring to the free area lists 6A–6D, the recording medium controller 42 determines whether or not the recording medium 1 has as many free blocks as required to record the file to be recorded. That is, the recording medium controller 42 determines whether or not the number of free blocks in the recording medium 1 is equal to or greater than the minimum required number of blocks $L_f$ determined in step S3.

If it is determined in step S4 that the number of free blocks is smaller than the minimum required number of blocks $L_f$, it is impossible to record the file into the recording medium 1. Thus, the process goes to step S5 and an existing file is deleted to create a required number of free blocks. Then the process returns to step S4.

If it is determined in step S4 that the number of free blocks is equal to or greater than the minimum required number of blocks $L_f$, the process goes to step S6. In step S6, the total number $L_c$ of parallel block sets used to record the file to be recorded (the number of parallel block sets constituting the superset of parallel blocks) and the interleaving numbers $I_i$ (i=i, 2, ..., $L_c$) associated with the respective parallel block sets (associated with the respective parallel block sets constituting the superset of parallel blocks) are determined. After determining the number of parallel block sets $L_c$ and the interleaving numbers $I_i$ in step S6, the process goes to step S7. In step S7, the recording medium controller 42 acquires the free area lists 6A–6D via the free area searching unit 5.

Then in step S8, the recording medium controller 42 refers to the free area lists 6A–6D and allocates as many parallel block sets as the number of parallel block sets $L_c$ determined in step S6 such that each parallel block set consists of as many blocks as the interleaving number $I_i$ determined also in step S6. That is, a superset of parallel blocks used to record the file to be recorded is allocated on the recording medium 1. After that, the process goes to step S9.

In step S9, it is determined whether or not as many parallel block sets as the number of parallel blocks $L_c$ determined in step S6, each parallel block set consisting of as many blocks as the interleaving number $I_i$ determined in step S6, have been successfully allocated. That is, it is determined whether a superset of parallel blocks required has been successfully allocated. If it is determined that the superset of parallel blocks has not been allocated successfully, then the process returns to step S6 so as to determine a combination of the number of parallel blocks $L_c$ and the interleaving number $I_i$ under the above-described conditions so that they have different values from the current values. The following process is then performed in the same manner as described above.

If it is determined in step S9 that the required superset of parallel blocks has been successfully allocated, that is, if as many parallel block sets as the number of parallel blocks $L_c$ determined in step S6, each parallel block set consisting of as many blocks as the interleaving number $I_i$ determined in step S6, have been successfully allocated, then the process goes to step S10. In step S10, a parallel block set to be used to record the file is selected from the supersets of parallel blocks consisting of the parallel block sets allocated in step S8 (hereinafter the selected parallel block set will also be referred to as the parallel block set of interest). In the specific example described above with reference to FIGS. 5A and 5B and FIGS. 6A and 6B, the selection of a parallel block set in step S10 is performed such that a parallel block set is selected row by row starting from the bottom row in the superset of parallel blocks. After that, the process goes to step S11.

In step S11, of the recording medium segments 1A–1D constituting the recording medium 1, one recording medium segment including a block contained in the parallel b block set of interest is selected and a chip select signal is applied to the selected recording medium segment. In the selection process in this step S11, the recording medium segment including a block which has been selected in preference to the other in the process of constructing the superset of parallel blocks is also selected herein in preference to the other recording medium segments.

Then the process goes to step S12 to determine the status of the selected recording medium segment. In step S12, if it is determined that the selected recording medium segment is in a busy state which is indicated by a busy signal, it is impossible to access the selected recording medium segment. In this case, the process returns to step S12. A recording medium segment which is selected first immediately after starting the data writing process is usually not in the busy state (instead, in the ready state). However, in the case where the free block generation process was performed in step S5, there is a possibility that the recording medium segment is busy to delete a file.

On the other hand, if it is determined in step S12 that the selected recording medium segment is in a ready state indicated by a ready signal, that is, if it is possible to access the selected recording medium segment, the process goes to step S13. In step S13, one page of data of the file to be recorded is recorded in a page of a block contained in the parallel block set of interest of the selected recording medium segment.

In a loop consisting of steps from S11 to S14, the recording of one page of data into a certain block in step S13 is performed successively starting from the first address of that block. For example, if the parallel block set consists of four blocks, that is, first to fourth blocks, and if each block consists of four pages, that is, first to fourth pages starting from the first address of each block, then data is recorded into the parallel block set in the following order: the first page of the first block; the first page of the second block; the first page of the third block; and the first page of the fourth block. After that, data is recorded in the order the second page of the first block, the second page of the second block, the second page of the third block, and the second page of the fourth block. After that, data is recorded in a similar manner until writing into the fourth page of the fourth block. The recording of data in step S13 is performed without having to wait for expiration of the programming time $t_{prog}$ as long as the interleaving number $I_i$ associated with the parallel block set (the number of blocks contained in the parallel block set) meets equations (2) and (3).

After recording one page of data in step S13, the process goes to step S14 to determine whether or not the whole parallel block set of interest has been recorded with data. If it is determined in step S14 that the whole parallel block set of interest has not been recorded with data, the process returns to step S11 and another recording medium segment is selected according to the selection priority defined above. A chip select signal is then applied to the selected recording medium segment. For example, if the parallel block set consists of four blocks, that is, first to fourth blocks, and if the superset of parallel blocks including the parallel block set of interest has been constructed by selecting blocks in the order first to fourth blocks, then selection in step S11 is performed in such a manner that the recording medium segment including the first block is selected first and then the recording medium segments including the second to fourth blocks, respectively, are selected successively. When the recording medium segment including the fourth block is selected, if recording of data for the whole first block is not completed, then the recording medium segment including the first block is again selected. During each iteration after that, step S11 selects a recording medium segment including a block contained in the parallel block set of interest in a similar manner until data has been recorded for the whole parallel block set of interest.

If it is determined in step S14 that recording of data has been completed for the whole parallel block set, then the process goes to step S15 to determine whether or not all data of the file being processed has been recorded. If it is determined in step S15 that recording is not completed for all data of the file being processed, then the process returns to step S10. In step S10, another parallel block set is selected as a new parallel block set of interest from remaining parallel block sets of the superset of parallel blocks allocated in step S8. After that, the recording process is performed in the same manner as performed for the previous parallel block set.

On the other hand, if it is determined in step S15 that all data of the file being processed has been recorded, then the process goes to step S16 and the block management information associated with the superset of parallel blocks in which the data of the file has been recorded. After that, the process goes to step S17. In step S17, the file management information associated with the file which has been recorded is updated, and thus the recording process is completed.

Figure 13:
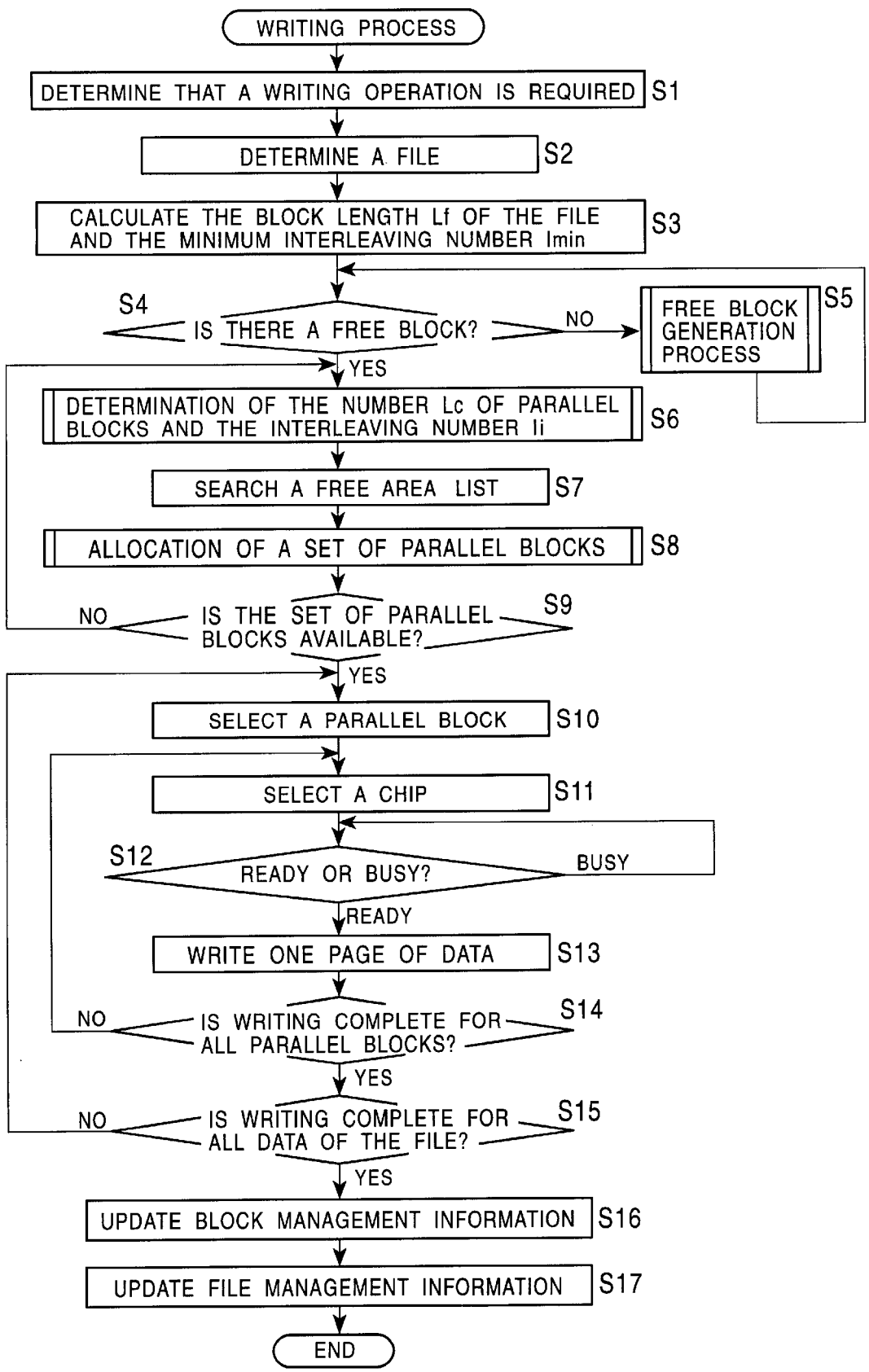
FIG. 13 is a flow chart illustrating a writing process performed by a recording medium controller shown in FIG. 11.

The process of generating free blocks in step S5 in FIG. 13 is described in further detail below with reference to FIG. 14.

In the free block generation process, some existing file is deleted to generate a writable area available for recording a file to be recorded. First, in step S21, a file to be deleted is determined. More specifically, the recording medium controller 42 selects a file which is temporally or logically oldest as a file to be deleted. Alternatively, the recording medium controller 42 may display on the display unit 12 the file names of files recorded on the recording medium 1 so that a user may select a file to be deleted by specifying it by the file name via the control unit 11. The file selected by the user is determined as the file to be deleted.

Then in step S22, the recording medium controller 42 searches the block management information to acquire block management information associated with the file to be deleted. The process then goes to step S23. In step S23, the parallel block sets in which the file to be deleted is stored are detected by referring to the block management information associated with the file to be deleted. More specifically, the recording medium controller 42 detects the first flag from the block management information associated with the file to be deleted, and further searches (refers to) the link information for the loop flag or the last flag thereby detecting the parallel block sets (hereinafter those parallel block sets will be referred to as detected parallel block sets).

Then the process goes to step S24, of the recording medium segments 1A–1D constituting the recording medium 1, one recording medium segment including a block contained in a detected parallel block set is selected and a chip select signal is applied to the selected recording medium segment. In this step S24, as in step S11 shown in FIG. 13, a recording medium segment including a block which was selected, in the process of recording the file which is now selected as the file to be deleted, in preference to the other when constructing the superset of parallel blocks is selected herein in preference to the other recording medium segments. In this process, it is possible to detect the selection priority employed when constructing the superset of parallel blocks, from the link information of the block management information.

After selecting the recording medium segment, the process goes to step S25 to detect the status of the selected recording medium segment as in step S12 shown in FIG. 13. If it is determined in step S25 that the selected recording medium segment is in a busy state, it is impossible to access the selected recording medium segment. In this case, the process returns to step S25. In general, the recording medium segment which was selected first immediately after the start of the free block generation process is not in the busy state (instead, is in a ready state).

On the other hand, in the case where it is determined in step S25 that the selected recording medium segment is in the ready state, the process goes to step S26 and data stored in a block contained in the detected parallel block set is deleted from the selected recording medium segment.

In the process of deleting data, unlike the data recording process in which data is recorded page by page, data is deleted block by block.

After deleting one block of data in step S26, the process goes to step S27 to determine whether or not data has been deleted for the whole detected parallel block set. If it is determined in step S27 that data has not been deleted for the whole detected parallel block set, the process returns to step S24 and another recording medium segment is selected according to the selection priority described above. After that, data is deleted in the same manner as performed for the previous recording medium segment.

If it is determined in step S27 that data has been deleted for the whole detected parallel block set, then the process goes to step S28 to determine whether or not all data of the file has been deleted. If it is determined in step S28 that all data of the file has not been deleted, then the process returns to step S23. In step S23, another parallel block set is selected in the above-described manner from remaining parallel block sets of the superset of parallel blocks in which the file being subjected to the deleting process. After that, step S24 and following steps are repeated.

If it is determined in step S28 that all data of the file being subjected to the deleing process has been deleted, then the process goes to step S29. In step S29, the block management information associated with the file which has been deleted is updated. More specifically, the corresponding valid flag is set. Then the process goes to step S30. In step S30, the file management information associated with the file which has been deleted is updated to −1 (which indicates, as described below with reference to FIG. 2, that no information is stored in the file management information), and the free block generation process is completed.

Figure 15:
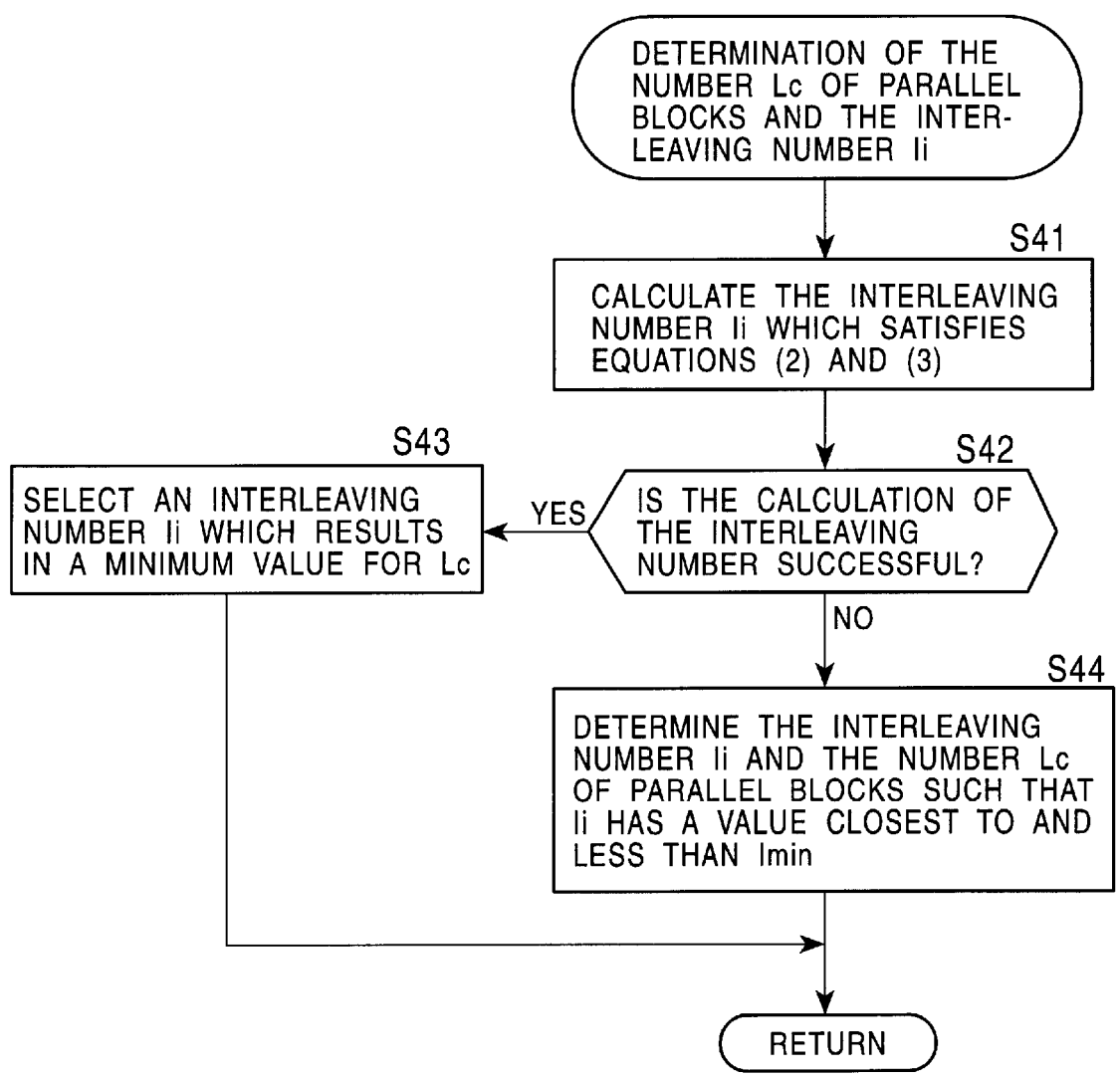
FIG. 15 is a flow chart illustrating the details of the process in step S6 shown in FIG. 13.

Referring now to the flow chart shown in FIG. 15, the process of determining the number of parallel block sets $L_c$ and the interleaving numbers $I_i$ performed in step S6 in FIG. 13 is described in detail below (this process will also be referred to simply as the determination process).

At first step in the determination process, that is, in step S41, the interleaving numbers $I_i$ which satisfy equations (2) and (3) are calculated from the minimum required number of blocks $I_f$ and the minimum number of blocks $I_{min}$ determined in step S3 in FIG. 13.

Then in step S42, it is determined whether or not the interleaving numbers $I_i$ satisfying equations (2) and (3) have been successfully obtained. If it is determined in step S42 that the interleaving numbers $I_i$ satisfying equations (2) and (3) have been successfully obtained, then the process goes to step S43. In step S43, of the interleaving numbers $I_i$ satisfying equation (2) and (3), an interleaving number which allows the number of parallel block sets $L_c$ to have a minimum value is selected, and the process returns to the main routine.

In the case where two or more patterns of interleaving numbers $I_i$ that satisfy equations (2) and (3) are obtained in step S41, interleaving numbers $I_i$ of each pattern are determined. In this case, in step S43, of the plurality of patterns, one that have a least value for the maximum value of suffix i associated with $I_i$ in the summation according to equation (3), that is, one that gives a least value for $L_c$, is selected, and the selected value is employed as the value for the interleaving number $I_i$ and the number of blocks $L_c$ used to record the specified file.

The interleaving numbers $I_i$ (i=1, 2, . . . , $L_c$) calculated in step S41 are not necessarily required to be equal to each other. They may or may not be equal to each other as long as $I_{min} \leq I_i \leq N$ (that is, as long as equation (3) is satisfied). However, to prevent the process from becoming complicated, it is desirable that the interleaving numbers $I_i$ (i=1, 2, . . . , $L_c$) be equal to each other.

If it is determined in step S42 that interleaving numbers $I_i$ satisfying both equations (2) and (3) are not obtained, that is, in the case where all interleaving numbers $I_i$ (i=1, 2, . . . , $L_c$) constrained by equation (2) cannot fall within the range defined by equation (3), then the process goes to step S44. In step S44, the interleaving numbers $I_i$ and the number of parallel block sets $L_c$ are determined such that there are as less interleaving numbers $I_i$ that are smaller than $I_{min}$ (basically such that there is only one such an interleaving number) and such that the interleaving numbers $I_i$ that are smaller than $I_{min}$ become closer to $I_{min}$. After determining the interleaving numbers $I_i$ and the number of parallel block sets $L_c$, the process returns to the main routine. In this case, one or more (basically one) of the interleaving numbers $I_i$ does not satisfy equation (3) although equation (2) is satisfied.

If it is determined in step S9 in FIG. 13 that as many parallel block sets containing blocks the number of which is equal to the interleaving numbers $I_i$, respectively, as the number of parallel block sets $L_c$ determined in the above determination process could not be allocated successfully, the determination process is performed again, as described above. In this case, the determination process is performed without including the combination of the interleaving numbers $I_i$ and the number of parallel blocks $L_c$ obtained in the determination process in step S43 or S44. That is, in the determination processes performed second and following times a combination of interleaving numbers $I_i$ and the number of parallel blocks $L_c$ other than those which have been already obtained is determined.

Figure 16:
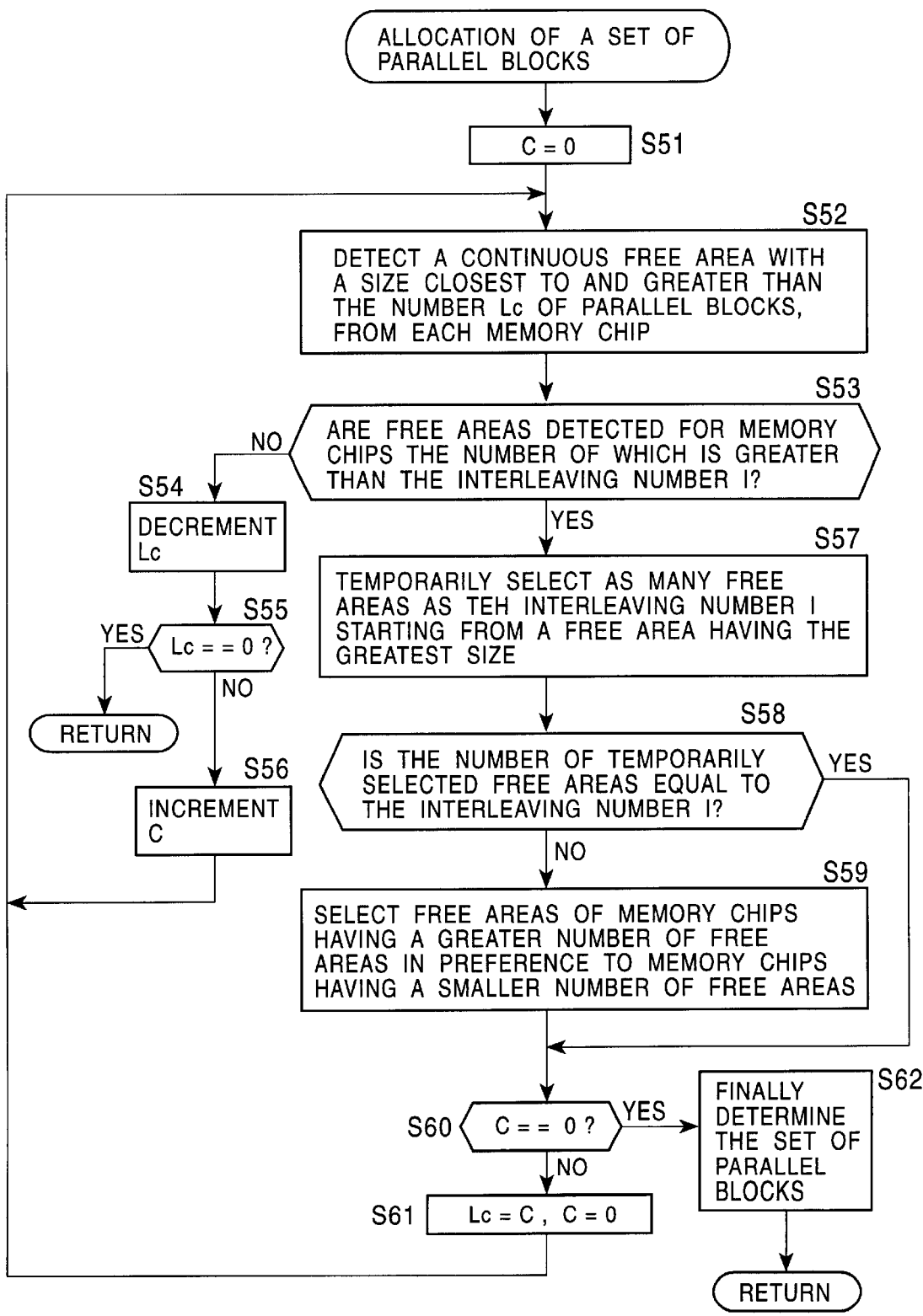
FIG. 16 is a flow chart illustrating the details of the process in step S8 shown in FIG. 13.

Referring now to the flow chart shown in FIG. 16, the process of allocating the superset of parallel blocks in step S8 in FIG. 13 is described in detail below.

First, in the process of allocating the superset of parallel blocks, a predetermined variable C is initialized to 0. Then in step S52, a free area containing successive blocks the number of which is greater than and closest to the number of parallel block sets $L_c$ determined in the determination process described above with reference to FIG. 15 is detected from each recording medium segment 1A–1D of the recording medium 1 (such a free area detected in such a manner will be referred to simply as a detected free area). Then in step S53, it is determined whether or not the detected free area has been obtained from as many or more recording medium segments of the recording medium segments 1A–1D than the interleaving number I determined in the determination process shown in FIG. 15. If it is determined that no such a detected free area is obtained from, then the process goes to step S54, and the number of parallel block sets $L_c$ is decremented by 1. The process then goes to step S55.

In step S55, it is determined whether or not the number of parallel block sets $L_c$ is equal to 0. If it is determined in step S55 that the number of parallel block sets $L_c$ is equal to 0, it is concluded that it is impossible to allocate a superset of parallel blocks required to record the specified file, and the process returns to the main routine. In this case, it is determined in step S9 in FIG. 13 that a superset of parallel blocks required to record the specified file could not be allocated successfully, and the process returns to step S6 to determine another combination of the number of parallel block sets $L_c$ and the interleaving numbers $I_i$. After that, the following steps are performed in a similar manner.

In the case where it is determined in step S55 that the number of parallel block sets $L_c$ is not equal to 0, the process goes to step S56 and the variable C is incremented by 1. The process then returns to step S52. In this case, step S52 and the following steps are performed again for the number of parallel block sets $L_c$ smaller than the previous number by 1.

If it is determined in step S53 that detected free areas were obtained from as many or more recording medium segments of the recording medium segments 1A–1D than the interleaving number I, then the process goes to step S57. In step S57, from the detected free areas the number of which is equal to or greater than the interleaving number I, as many detected free areas as the interleaving number I are temporarily selected such that a detected free area with a larger size is selected in preference to a detected free area with a smaller size. The process then goes to step S58.

In step S58, it is determined whether or not the number of detected free areas temporarily selected in step S57 is equal to the interleaving number I. If it is determined that the number of detected free areas temporarily selected in step S57 is equal to the interleaving number I, then $L_c$ successive blocks are selected from each of the detected free areas the number of which is equal to the interleaving number I. Thus, Lc parallel block sets each containing as many blocks as the interleaving number I are obtained. In this case, step S59 is skipped, and the process goes to step S60.

On the other hand, if it is determined in step S58 that the number of detected free areas temporarily selected in step S57 is not equal to the interleaving number I, that is, in the case where when there are a plurality of detected free areas whose size is equal to each other, if the plurality of detected free areas are temporarily selected then the total number of detected free areas selected becomes greater than the interleaving number, however if the plurality of such detected free areas are not temporarily selected then the total number of detected free areas selected becomes smaller than the interleaving number I, the process goes to step S59. In step S59, of the plurality of detected free areas with the same size, a detected free area of a recording medium having a greater number of free areas is temporarily selected in preference to the other so that the total number of detected free areas temporarily selected becomes equal to the interleaving number I. Furthermore, in step S59, $L_c$ successive blocks are selected from each of the detected free areas the number of which is equal to the interleaving number I so that $L_c$ parallel block sets each containing as many blocks as the interleaving number I are obtained.

Then in step S60, it is determined whether or not the variable C is equal to 0. If it is determined in step S60 that the variable C is not equal to 0, that is, in the case where the temporary selection of as many detected free areas as the interleaving number I is performed for the number of blocks $L_c$ set to a value smaller than its original value by I or greater, the process goes to step S61. In step S61, the number of parallel block sets $L_c$ is set to a value equal to the variable C, and the variable C is then initialized to 0. The process then returns to step S52. In this case, the number of parallel block sets $L_c$ decremented in step S54 is employed as a new number of parallel block sets $L_c$, and step S52 and the following steps are repeated.

If it is determined in step S60 that the variable C is equal to 0, then the process goes to step S62. In this case, the parallel block sets obtained at this stage are finally determined as those used to construct the superset of parallel blocks, and the process returns to the main routine.

Figure 17:
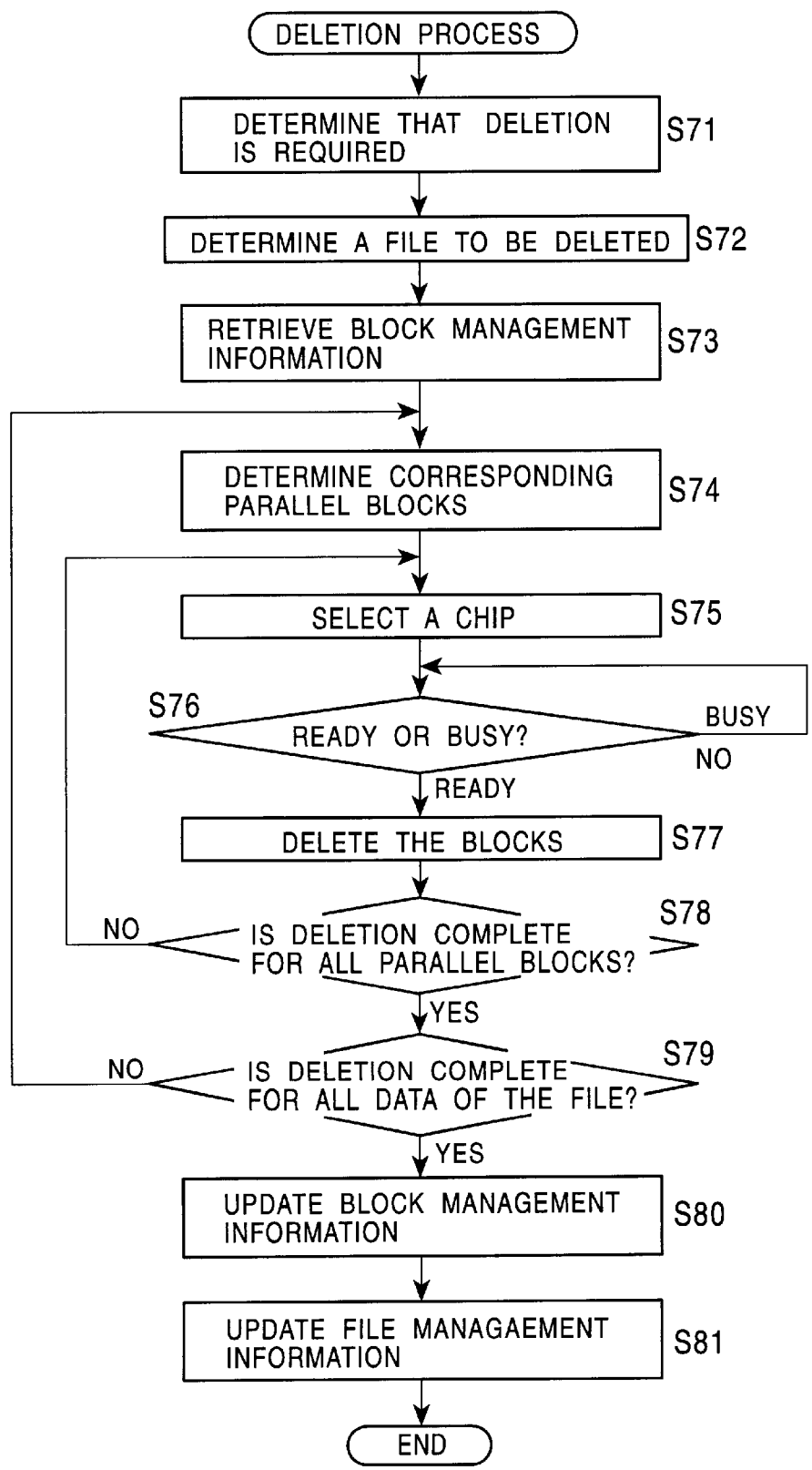
FIG. 17 is a flow chart illustrating a deleting process performed by the recording medium controller shown in FIG. 11.

Referring now to the flow chart shown in FIG. 17, the process (deleting process) performed by the recording medium controller 42 shown in FIG. 11 to delete data recorded on the recording medium 1 is described in detail below.

The deleting process is performed when, for example, a user issues a data deletion command via the control unit 11.

If the user issues the data deletion command via the control unit 11, the data deletion command is sent from the control unit 11 to the recording medium controller 42. In response to the data deletion command, the recording medium controller 42 recognizes in step S71 that it is requested to delete a file from the recording medium 1. The recording medium controller 42 accesses the file management information and displays the file names of the files recorded on the recording medium 1 on the display unit 12. If the user designates the file name of a particular file to be deleted via the control unit 11, then the recording medium controller 42 determines, in step S72, that the designated file should be deleted.

Figure 14:
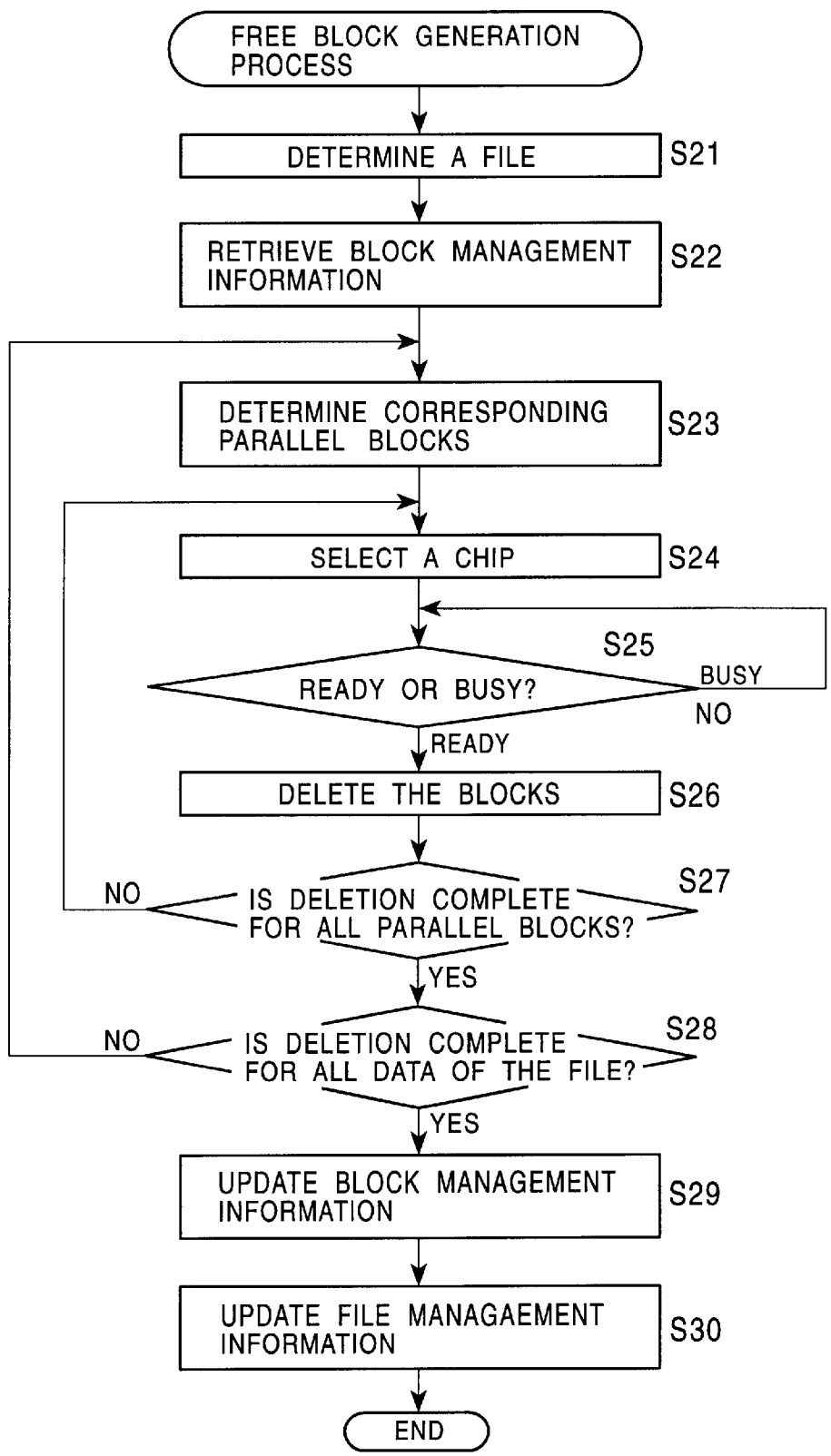
FIG. 14 is a flow chart illustrating the details of the process in step S5 shown in FIG. 13.

Then the following steps from S73 to S81 are performed in a similar manner to steps from S22 to S30 in FIG. 14 until the deleting process is completed.

Figure 18:
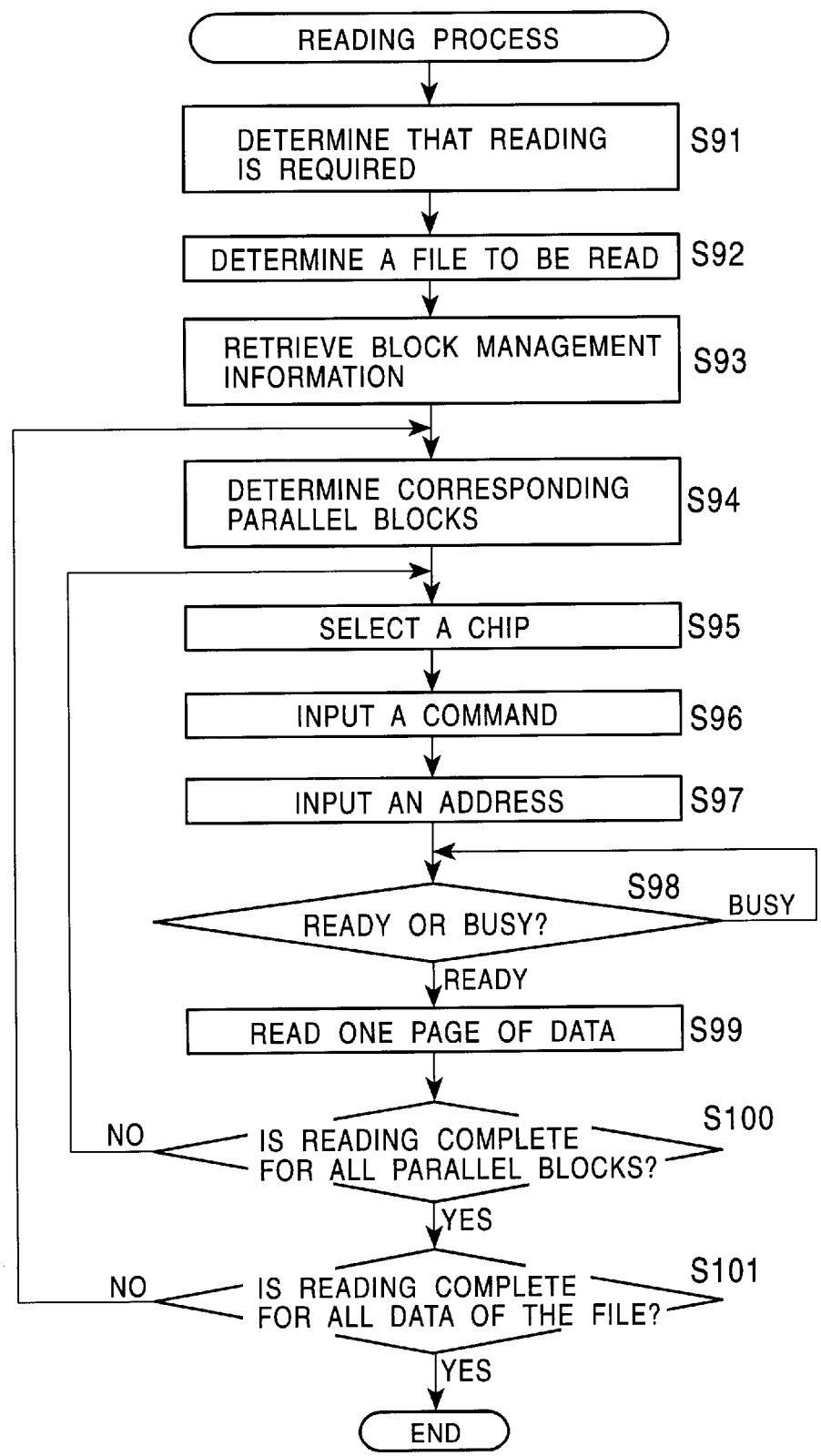
FIG. 18 is a flow chart illustrating a reading process performed by a recording medium controller shown in FIG. 11.

Referring now to the flow chart shown in FIG. 18, the process (reading process) performed by the recording medium controller 42 to read data recorded on the recording medium 1 is described in detail below.

The reading of data (file) from the recording medium 1 is performed when, for example, a user issues a reproduction command via the control unit 11. The reproduction command is sent from the control unit 11 to the recording medium controller 42. the recording medium controller 42 recognizes in step S91 that it is requested to read data from the recording medium 1.

Upon receipt of the reproduction command, the recording medium controller 42 accesses the file management information stored in the file management information memory 2 and controls the display unit 12 via the reproduction controller 43 so that the file names of files stored on the recording medium 1 are displayed on the display unit 12. The user decides which file should be read from the recording medium 1 by referring to the file names displayed on the display unit 12 and designates a desired file by operating the control unit 11. The signal indicating the designated file name is sent to the recording medium controller 42. From this signal, the recording medium controller 42 determines in step S92 which file should be read from the recording medium 1.

Then in step S93, the recording medium controller 42 searches the block management information to acquire block management information associated with the file to be read. The process then goes to step S94. In step S94, the parallel block sets in which the file to be read is stored are detected by referring to the block management information associated with the file to be read. More specifically, the recording medium controller 42 detects the first flag from the block management information associated with the file to be read. Furthermore, the recording medium controller 42 searches (refers to) the link information for the loop flag or the last flag thereby detecting the parallel block sets (hereinafter such parallel block sets will also be referred to as detected parallel block sets).

Then in step S95, from the recording medium segments 1A–1D constituting the recording medium 1, a recording medium segment including a block contained in a detected parallel block set is selected (such a recording medium segment will also be referred to as a selected recording medium segment), and a chip select signal is applied to the selected recording medium segment. Also in this step S95, as in step S11 shown in FIG. 13, a recording medium segment including a block which was selected, in the process of recording the file which is now selected as the file to be read, in preference to the other when constructing the superset of parallel blocks is selected herein in preference to the other recording medium segments. In this process, as described earlier, it is possible to detect the selection priority employed when constructing the superset of parallel blocks, from the link information of the block management information.

After selecting the recording medium segment, the process goes to step S96. In step S96, a read command is supplied to the selected recording medium segment, and then the process goes to step S97. In step S97, address data indicating the address at which the data to be read is stored is supplied to the selected recording medium segment. The process then goes to step S98.

In step S98, as in step S12 shown in FIG. 13, the status of the selected recording medium segment is detected. If it is determined in step S98 that the selected recording medium segment is in a busy state, it is impossible to access the selected recording medium segment. In this case, the process returns to step S98.

On the other hand, in the case where it is determined in step S98 that the selected recording medium segment is in a ready state, the process goes to step S99, and one page of data is read from a block contained in the detected parallel block set of the selected recording medium segment.

In a loop consisting of steps from S95 to S100, reading of one page of data from a block in step S99 is performed successively starting from the first address of that block. For example, if the parallel block set consists of four blocks, that is, first to fourth blocks, and if each block consists of four pages, that is, first to fourth pages starting from the first address of each block, then data is read from the parallel block set in the following order: the first page of the first block; the first page of the second block; the first page of the third block; and the first page of the fourth block. After that, data is read in the order the second page of the first block, the second page of the second block, the second page of the third block, and the second page of the fourth block. After that, data is read in a similar manner until reading the fourth page of the fourth block.

One page of data read in step S99 is supplied by the recording medium controller 42 to the transfer controller 41 or the reproduction controller 43. The process then goes to step S100 to determine whether or not data has been read for the whole detected parallel block set. If it is determined in step S100 that data has not been read for the whole detected parallel block set, then the process returns to step S95, and another recording medium segment is selected according to the selection priority described above, and a chip select signal is applied to the selected recording medium segment.

If it is determined in step S100 that data has been read from the whole detected parallel block set, then the process goes to step S101 to determine whether or not all data of the designated file has been read. If it is determined in step S101 that reading is not completed for all data of the designated file, the process returns to step S94. In step S94, another parallel block set is selected from remaining parallel block sets of the superset of parallel blocks in which the designated file is recorded. After that, step S95 and the following steps are repeated.

If it is determined in step S101 that all data of the designated file has been read, the reading process is completed.

As described above, in the present embodiment, data recorded on the recording medium 1 is managed in units of files and also in units of blocks so that when data is recorded into a parallel block superset consisting of one or more parallel block sets each consisting of one or more blocks, the parallel block sets are constructed such that the parallel block sets contain as many blocks as required to minimize the waiting time thereby achieving a maximum advantage of the increase in the writing speed according to the parallel recording method. Furthermore, the parallel block sets are constructed by selecting blocks in such a manner as not creating a significant difference in the size of free areas over the recording medium 1 thereby minimizing fragmentation of free areas thus making it possible to use the recording areas of the recording medium 1 in a highly efficient fashion.

Although in the present embodiment, the recording medium is formed of four recording medium segments 1A–1D, the number of recording medium segments contained in the recording medium 1 is not limited to 4.

Although in the present embodiment, the recording medium 1 is formed using semiconductor flash memories, the recording medium 1 may also be formed using semiconductor memories of the type other than the flash memory. Instead of semiconductor memories, a random access recording medium in the form of a disk such as a magneto-optic disk may also be employed.

In addition to a recording medium of the type capable of both reading and writing, a read-only recording medium may also be employed. However, when a read-only recording medium is employed as the recording medium 1, the user terminal serves only as a reproducing apparatus dedicated to reproduction of data.

Although in the present embodiment, the parallel block sets are constructed in units of blocks and data is managed also in units of blocks, the parallel block sets may also be constructed in other units greater or smaller than blocks, for example in units pages.

The order in which data is recorded in blocks of parallel block sets may be arbitrarily determined. However, in the case where data is successively recorded over two or more blocks, it is desirable that data be recorded into blocks of a certain parallel block set as the same order as that in which data is next recorded into blocks of another parallel block set.

More specifically, in the case where two parallel block sets, that is, first and second parallel block sets, are constructed such that each set contains four blocks each selected from the recording medium segments 1A–1D, respectively, and such that the four blocks are arranged from left to right, when data is recorded into the second parallel block set after writing data into the first parallel block set successively staring from the leftmost block toward the rightmost block, it is desirable that the data be recorded successively also starting from the leftmost block toward the rightmost block. In this specific example, if it is tried to record the data into the four blocks of the second parallel block set starting from the rightmost block toward the leftmost block, it is required to record data into the block at the rightmost position of the second parallel block set after completion of recording data into the block at the leftmost position of the first parallel block set. In this case, data is recorded successively into two blocks of the same recording medium segment, that is, 1D in this specific case. Therefore, when the recording of data into the second parallel block set is started after completion of recording data into the first parallel block set, the advantage of deletion of the waiting time according to the parallel recording method is lost.

When the user terminal is constructed as shown in FIG. 8, the recording process (FIG. 13) and the deleting process (FIG. 17) are performed on the memory card 21 by the information supplying apparatus shown in FIG. 9 or 10. In this case, the user terminal itself needs only a capability of reading data (FIG. 18), and capabilities of recording and deleting data are not necessary. However, even in the case where the user terminal is constructed in the manner shown in FIG. 8, it is also possible to form the user terminal such that data may be recorded or deleted when the memory card 21 is in the slot 20.

In FIG. 11, the file management information memory 2 for storing the file management information is not necessarily needed to be formed in a physically separate fashion. Instead, the file management information may be stored in, for example, a system block allocated in some recording medium segment 1A–1D of the recording medium 1. Similarly, the block management information memory 3 for storing the block management information is not necessarily needed to be formed in a physically separate fashion.

According to the recording apparatus and recording method of the present embodiment, as described above, one or more parallel block sets each consisting of one or more blocks the number of which is determined in accordance with a minimum number of blocks which allows a waiting time to become minimum when data is recorded in a parallel fashion into the one or more blocks of the recording medium 1, and the data is recorded in the parallel fashion into the one or more blocks of the one or more parallel block sets. This allows the data to be recorded in a short time.

In the recording medium according to the present embodiment, one or more parallel block sets are constructed which consist of one or more blocks the number of which is determined in accordance with a minimum number of blocks which allows a waiting time to become minimum in the process of recording data in the parallel fashion into the one or more blocks of the recording medium, and the data is recorded in the parallel fashion in the one or more blocks of the one or more parallel block sets. This allows the data to be recorded on the recording medium in a short time.

The recording medium according to the present embodiment stores the minimum number of blocks which allows a waiting time to become minimum when the data is recorded in the parallel fashion into one or more blocks or information required to determine the minimum number of blocks. Therefore, when one or more parallel block sets each consisting of one or more blocks are constructed, it is possible to determine the number of blocks of each parallel block set in accordance with the minimum number of blocks stored on the recording medium. By recording data into the one or more blocks determined in the above-described manner, it becomes possible to record data in a short time.

In the reproducing apparatus and reproducing method according to the present embodiment, data is read from a recording medium on which data is recorded in such a manner that one or more parallel block sets are constructed which consist of one or more blocks the number of which is determined in accordance with a minimum number of blocks which allows a waiting time to become minimum when the data is recorded in the parallel fashion into the one or more blocks of the recording medium, and the data is recorded in the parallel fashion in the one or more blocks of the one or more parallel block sets. By employing such a reproducing apparatus and/or reproducing method, it becomes possible to read data which was recorded in a short time.

In the recording apparatus and recording method according to the present embodiment, one or more parallel block sets each consisting of one or more blocks used to record data are constructed in such a manner as not to create a significant difference in the size of a writable area available for recording data among a plurality of recording areas, and the data is recorded in the parallel fashion in the one or more blocks of the one or more parallel block sets. By employing such a recording apparatus and/or recording method, it becomes possible to record data without creating a significant difference in the writable area size among the plurality of recording areas.

In the recording medium according to the present embodiment, data is recorded on the recording medium in such a manner that one or more parallel block sets each consisting of one or more blocks used to record the data are constructed in such a manner as not to create a significant difference in the size of a writable area available for recording data among a plurality of recording areas, and the data is recorded in the parallel fashion in the one or more blocks of the one or more parallel block sets. By employing such a recording medium, it becomes possible to record data without creating a significant difference in the writable area size among the plurality of recording areas.

In the reproduction apparatus and reproduction method according to the present embodiment, data is read from a recording medium on which the data is recorded in such a manner that one or more parallel block sets each consisting of one or more blocks used to record the data are constructed in such a manner as not to create a significant difference in the size of a writable area available for recording data among a plurality of recording areas, and the data is recorded in the parallel fashion in the one or more blocks of the one or more parallel block sets. By employing such a reproducing apparatus and/or reproducing method, it becomes possible to read data without creating a significant difference in the writable area size among the plurality of recording areas.

What is claimed is:

1. A recording apparatus for recording data in a parallel fashion in a recording area of a recording medium, said recording area being managed in units of predetermined blocks, said recording apparatus comprising:

construction means for constructing one or more parallel block sets each consisting of one or more blocks the number of which is determined in accordance with a minimum number of blocks which allows a waiting time to become minimum in the process of recording the data in the parallel fashion into one or more blocks of the recording medium; and recording means for recording the data in the parallel fashion into said one or more blocks of said one or more parallel block sets.

2. A recording apparatus according to claim 1, wherein said minimum number of blocks is recorded on said recording medium.

3. A recording apparatus according to claim 1, further comprising calculation means for calculating said minimum number of blocks.

4. A recording apparatus according to claim 3, wherein said calculation means for calculating the minimum number of blocks calculates said minimum number of blocks on the basis of characteristic information representing a characteristic of said recording medium.

5. A recording apparatus according to claim 4, wherein said characteristic information is recorded on said recording medium.

6. A recording apparatus according to claim 4, wherein said characteristic information includes at least an inputting time indicating a time required to input data to be recorded to the recording medium and a programming time indicating a time required to record the data on the recording medium after inputting the data to be recorded.

7. A recording apparatus according to claim 6, wherein said calculation means for calculating the minimum number of blocks calculates said minimum number of blocks as a value equal to 1 plus the quatient obtained by dividing said programming time by said inputting time.

8. A recording apparatus according to claim 1, wherein said recording medium includes a plurality of recording areas partitioned from each other, and wherein in the case where said recording means performs recording in the parallel fashion into two or more recording areas of said plurality of recording areas, said construction means selects one or more blocks used to construct said one or more parallel blocks, from two or more of said plurality of recording areas in such a manner as not to create a significant difference in the size of a writable area available for recording data among said plurality of recording areas.

9. A recording apparatus according to claim 8, further comprising writable area management means for managing the writable area of each of said plurality of recording areas, wherein said construction means selects said one or more blocks used to construct said one or more parallel block sets on the basis of the status managed by said writable area management means.

10. A recording apparatus according to claim 9, wherein said writable area management means manages said writable area of each of said plurality of recording areas in units of free areas, each free area including one or more writable blocks located at physically successive positions.

11. A recording apparatus according to claim 10, wherein said construction means comprises:

free area detecting means for detecting, from each of said plurality of recording areas, a free area consisting of one or more blocks the number of which is greater than and closest to the number of parallel block sets capable of recording the data; and free area selecting means for selecting one or more free areas used to construct the parallel block set, from the free areas detected by said free area detecting means.

12. A recording apparatus according to claim 11, wherein said free area selecting means selects said one or more free areas from the free areas detected by the free area detecting means such that a free area with a greater size is selected in preference with a free area with a smaller size.

13. A recording apparatus according to claim 11, wherein said free area selecting means selects said one or more free areas such that a free area contained in a recording area including a greater number of free areas is selected in preference to a free area contained in a recording area including a smaller number of free areas.

14. A recording apparatus according to claim 8, wherein said recording medium comprises a plurality of recording medium segments corresponding to said plurality of recording areas, respectively.

15. A recording apparatus according to claim 1, further comprising said recording medium.

16. A recording apparatus according to claim 1, wherein said recording medium is removable.

17. A recording apparatus according to claim 1, further comprising supplying means for supplying data received from an external device to said recording means.

18. A recording apparatus according to claim 1 wherein said recording medium is capable of deleting data recorded thereon, in units of said blocks.

19. A recording apparatus according to claim 1, wherein said recording medium is a semiconductor memory.

20. A recording apparatus according to claim 1, wherein said recording medium is formed in a disk shape.

21. A recording method for recording data in a parallel fashion in a recording area of a recording medium, said recording area being managed in units of predetermined blocks, said method comprising the steps of:

constructing one or more parallel block sets each consisting of one or more blocks the number of which is determined in accordance with a minimum number of blocks which allows a waiting time to become minimum in the process of recording the data in the parallel fashion into one or more blocks of the recording medium; and recording the data in the parallel fashion into said one or more blocks of said one or more parallel block sets.

22. A recording method according to claim 21, wherein said minimum number of blocks is recorded on said recording medium.

23. A recording method according to claim 21, further comprising the step of calculating said minimum number of blocks.

24. A recording method according to claim 23, wherein said step of calculating the minimum number of blocks calculates said minimum number of blocks on the basis of characteristic information representing a characteristic of said recording medium.

25. A recording method according to claim 24, wherein said characteristic information is recorded on said recording medium.

26. A recording method according to claim 24, wherein said characteristic information includes at least an inputting time indicating a time required to input data to be recorded to the recording medium and a programming time indicating a time required to record the data on the recording medium after inputting the data to be recorded.

27. A recording method according to claim 26, wherein said step of calculating the minimum number of blocks calculates said minimum number of blocks as a value equal to 1 plus the quatient obtained by dividing said programming time by said inputting time.

28. A recording method according to claim 21, wherein said recording medium includes a plurality of recording areas partitioned from each other,
and wherein in the case where said recording step performs recording in the parallel fashion into two or more recording areas of said plurality of recording areas, said construction step selects one or more blocks used to construct said one or more parallel blocks, from two or more of said plurality of recording areas in such a manner as not to create a significant difference in the size of a writable area available for recording data among said plurality of recording areas.

29. A recording method according to claim 28, further comprising the step of managing the writable area of each of said plurality of recording areas,
wherein said construction step selects said one or more blocks used to construct said one or more parallel block sets on the basis of the status managed in said writable area management step.

30. A recording method according to claim 28, wherein said writable area management step manages said writable area of each of said plurality of recording areas in units of free areas, each free area including one or more writable blocks located at physically successive positions.

31. A recording method according to claim 30, wherein said construction step comprises the steps of:
detecting, from each of said plurality of recording areas, a free area consisting of one or more blocks the number of which is greater than and closest to the number of parallel block sets capable of recording the data; and
selecting one or more free areas used to construct the parallel block set, from the free areas detected in said free area selecting step.

32. A recording method according to claim 31, wherein said free area selecting step selects said one or more free areas from the free areas detected in said free area detecting step such that a free area with a greater size is selected in preference with a free area with a smaller size.

33. A recording method according to claim 31, wherein said free area selecting step selects said one or more free areas such that a free area contained in a recording area including a greater number of free areas is selected in preference to a free area contained in a recording area including a smaller number of free areas.

34. A recording method according to claim 28, wherein said recording medium comprises a plurality of recording medium segments corresponding to said plurality of recording areas, respectively.

35. A recording method according to claim 21, wherein said recording medium is capable of deleting data recorded thereon, in units of said blocks.

36. A recording method according to claim 21, wherein said recording medium is a semiconductor memory.

37. A recording method according to claim 21, wherein said recording medium is formed in a disk shape.

38. A recording medium for recording data in a parallel fashion in a recording area which is managed in units of predetermined blocks, wherein one or more parallel block sets are constructed which consist of one or more blocks the number of which is determined in accordance with a minimum number of blocks which allows a waiting time to become minimum in the process of recording data in the parallel fashion into said one or more blocks of the recording medium, and said data is recorded in the parallel fashion in said one or more blocks of said one or more parallel block sets.

39. A recording medium according to claim 38, wherein said minimum number of blocks is recorded on said recording medium.

40. A recording medium according to claim 38, wherein said minimum number of blocks was calculated on the basis of characteristic information representing a characteristic of said recording medium.

41. A recording medium according to claim 40, wherein said characteristic information is recorded on said recording medium.

42. A recording medium according to claim 40, wherein said characteristic information includes at least an inputting time indicating a time required to input data to be recorded and a programming time indicating a time required to record the data after inputting the data to be recorded.

43. A recording medium according to claim 42, wherein said minimum number of blocks is equal to 1 plus the quatient obtained by dividing said programming time by said inputting time.

44. A recording medium according to claim 38, including a plurality of recording areas partitioned from each other, wherein
one or more blocks used to construct said one or more parallel blocks are selected from two or more of said plurality of recording areas in such a manner as not to create a significant difference in the size of a writable area available for recording data among said plurality of recording areas, and said data is recorded in the parallel fashion into said blocks.

45. A recording medium according to claim 44, wherein the writable area in each of said plurality of recording areas is managed, and said one or more blocks constituting said one or more parallel block sets are selected in accordance with the status managed.

46. A recording medium according to claim 45, wherein said writable area of each of said plurality of recording areas is managed in units of free areas, each free area including one or more writable blocks located at physically successive positions.

47. A recording medium according to claim 46, wherein a free area consisting of one or more blocks the number of which is greater than and closest to the number of parallel block sets capable of recording the data is selected from each of said plurality of recording areas, said one or more free areas used to construct said one or more parallel block sets are selected from said free areas detected.

48. A recording medium according to claim 47, wherein said one or more free areas are selected from the free areas detected such that a free area with a greater size is selected in preference with a free area with a smaller size.

49. A recording medium according to claim 47, wherein said one or more free areas are selected such that a free area contained in a recording area including a greater number of free areas is selected in preference to a free area contained in a recording area including a smaller number of free areas.

50. A recording medium according to claim 44, comprising a plurality of recording medium segments corresponding to said plurality of recording areas, respectively.

51. A recording medium according to claim 38, being adapted to be removable from a recording apparatus for recording said data.

52. A recording medium according to claim 38, being adapted to be capable of deleting data recorded thereon, in units of said blocks.

53. A recording medium according to claim 38, comprising a semiconductor memory.

54. A recording medium according to claim 38, wherein said recording medium is formed in a disk shape.

55. A recording medium for recording data in a parallel fashion in a recording area which is managed in units of predetermined blocks, wherein a minimum number of blocks which allows a waiting time to become minimum in the process of recording said data in the parallel fashion into one or more blocks or information required to determine said minimum number of blocks is recorded on said recording medium.

56. A reproducing apparatus for reproducing data from a recording medium, said data being recorded in a parallel fashion in a recording area of said recording medium, said recording area being managed in units of predetermined blocks, said reproducing apparatus comprising reading means for reading said data from said recording medium on which said data is recorded in such a manner that one or more parallel block sets are constructed which consist of one or more blocks the number of which is determined in accordance with a minimum number of blocks which allows a waiting time to become minimum in the process of recording said data in the parallel fashion into said one or more blocks of the recording medium, and said data is recorded in the parallel fashion in said one or more blocks of said one or more parallel block sets.

57. A reproducing apparatus according to claim 56, wherein said recording medium is dedicated to reading.

58. A reproducing method for reproducing data from a recording medium, said data being recorded in a parallel fashion in a recording area of said recording medium, said recording area being managed in units of predetermined blocks, said method comprising the step of reading said data from said recording medium on which said data is recorded in such a manner that one or more parallel block sets are constructed which consist of one or more blocks the number of which is determined in accordance with a minimum number of blocks which allows a waiting time to become minimum in the process of recording said data in the parallel fashion into said one or more blocks of the recording medium, and said data is recorded in the parallel fashion in said one or more blocks of said one or more parallel block sets.

59. A recording apparatus for recording data in a parallel fashion in a plurality of recording areas of a recording medium, said plurality of recording areas being managed in units of predetermined blocks, said recording apparatus comprising:
construction means for constructing one or more parallel block sets each consisting of one or more blocks used to record the data, in such a manner as not to create a significant difference in the size of a writable area available for recording data among said plurality of recording areas; and
recording means for recording in the parallel fashion the data into said one or more blocks of said one or more parallel block sets.

60. A recording apparatus according to claim 59, further comprising writable area management means for managing the writable area of each of said plurality of recording areas, wherein said construction means determines said one or more blocks used to construct said one or more parallel block sets on the basis of the status managed by said writable area management means.

61. A recording apparatus according to claim 60, wherein said writable area management means manages said writable area of each of said plurality of recording areas in units of free areas, each free area including one or more writable blocks located at physically successive positions.

62. A recording apparatus according to claim 61, wherein said construction means comprises:
free area detecting means for detecting, from each of said plurality of recording areas, a free area consisting of one or more blocks the number of which is greater than and closest to the number of parallel block sets capable of recording the data; and
free area selecting means for selecting one or more free areas used to construct the parallel block set, from the free areas detected by said free area detecting means.

63. A recording apparatus according to claim 62, wherein said free area selecting means selects said one or more free areas from the free areas detected by the free area detecting means such that a free area with a greater size is selected in preference with a free area with a smaller size.

64. A recording apparatus according to claim 62, wherein said free area selecting means selects said one or more free areas such that a free area contained in a recording area including a greater number of free areas is selected in preference to a free area contained in a recording area including a smaller number of free areas.

65. A recording apparatus according to claim 62, wherein if said free area detecting means cannot detect at least as many free areas as the number of blocks contained in a parallel block set, each said free area consisting of blocks the number of which is greater than and closest to the number of parallel block sets capable of recording said data, then said free area detecting means detects a free area from each of said plurality of recording areas, said free area consisting of blocks the number of which is greater than and closest to the number of parallel block sets capable of recording said data minus a predetermined number.

66. A recording apparatus according to claim 59, wherein said recording medium comprises a plurality of recording medium segments corresponding to said plurality of recording areas, respectively.

67. A recording apparatus according to claim 59, further comprising said recording medium.

68. A recording apparatus according to claim 59, wherein said recording medium is removable.

69. A recording apparatus according to claim 59, further comprising supplying means for supplying data received from an external device to said recording means.

70. A recording apparatus according to claim 59, wherein said recording medium is capable of deleting data recorded thereon, in units of said blocks.

71. A recording apparatus according to claim 59, wherein said recording medium is a semiconductor memory.

72. A recording apparatus according to claim 59, wherein said recording medium is formed in a disk shape.

73. A recording method for recording data in a parallel fashion in a plurality of recording areas of a recording medium, said plurality of recording areas being managed in units of predetermined blocks, said method comprising the steps of:

constructing one or more parallel block sets each consisting of one or more blocks used to record the data, in such a manner as not to create a significant difference in the size of a writable area available for recording data among said plurality of recording areas; and recording the data in the parallel fashion into said one or more blocks of said one or more parallel block sets.

74. A recording method according to claim 73, further comprising the step of the step of managing the writable area of each of said plurality of recording areas, wherein said construction step determines said one or more blocks used to construct said one or more parallel block sets on the basis of the status managed in said writable area management step.

75. A recording method according to claim 74, wherein said writable area management step manages said writable area of each of said plurality of recording areas in units of free areas, each free area including one or more writable blocks located at physically successive positions.

76. A recording method according to claim 75, wherein said construction step comprises the steps of:

detecting, from each of said plurality of recording areas, a free area consisting of one or more blocks the number of which is greater than and closest to the number of parallel block sets capable of recording the data; and selecting one or more free areas used to construct the parallel block set, from the free areas detected in said free area selecting step.

77. A recording method according to claim 76, wherein said free area selecting step selects said one or more free areas from the free areas detected in said free area detecting step such that a free area with a greater size is selected in preference with a free area with a smaller size.

78. A recording method according to claim 76, wherein said free area selecting step selects said one or more free areas such that a free area contained in a recording area including a greater number of free areas is selected in preference to a free area contained in a recording area including a smaller number of free areas.

79. A recording method according to claim 76, wherein if said free area detecting step cannot detect at least as many free areas as the number of blocks contained in a parallel block set, each said free area consisting of blocks the number of which is greater than and closest to the number of parallel block sets capable of recording said data, then said free area detecting step detects a free area from each of said plurality of recording areas, said free area consisting of blocks the number of which is greater than and closest to the number of parallel block sets capable of recording said data minus a predetermined number.

80. A recording method according to claim 73, wherein said recording medium comprises a plurality of recording medium segments corresponding to said plurality of recording areas, respectively.

81. A recording method according to claim 73, wherein said recording medium is capable of deleting data recorded thereon, in units of said blocks.

82. A recording method according to claim 73, wherein said recording medium is a semiconductor memory.

83. A recording method according to claim 73, wherein said recording medium is formed in a disk shape.

84. A recording medium for recording data in a parallel fashion in a plurality of recording areas which are managed in units of predetermined blocks, wherein said data is recorded in such a manner that one or more parallel block sets each consisting of one or more blocks used to record the data are constructed in such a manner as not to create a significant difference in the size of a writable area available for recording data among said plurality of recording areas, and said data is recorded in the parallel fashion in said one or more blocks of said one or more parallel block sets.

85. A reproducing apparatus for reproducing data from a recording medium, said data being recorded in a parallel fashion in a plurality of recording areas of said recording medium, said plurality of recording areas being managed in units of predetermined blocks, said reproducing apparatus comprising reading means for reading data from said recording medium on which said data is recorded in such a manner that one or more parallel block sets each consisting of one or more blocks used to record the data are constructed in such a manner as not to create a significant difference in the size of a writable area available for recording data among said plurality of recording areas, and said data is recorded in the parallel fashion in said one or more blocks of said one or more parallel block sets.

86. A reproducing method for reproducing data from a recording medium, said data being recorded in a parallel fashion in a plurality of recording areas of said recording medium, said plurality of recording areas being managed in units of predetermined blocks, said method comprising the step of reading data from said recording medium on which said data is recorded in such a manner that one or more parallel block sets each consisting of one or more blocks used to record the data are constructed in such a manner as not to create a significant difference in the size of a writable area available for recording data among said plurality of recording areas, and said data is recorded in the parallel fashion in said one or more blocks of said one or more parallel block sets.

* * * * *